US011164823B2

(12) United States Patent
Huang

(10) Patent No.: US 11,164,823 B2
(45) Date of Patent: Nov. 2, 2021

(54) SEMICONDUCTOR DEVICE WITH CRACK-DETECTING STRUCTURE AND METHOD FOR FABRICATING THE SAME

(71) Applicant: NANYA TECHNOLOGY CORPORATION, New Taipei (TW)

(72) Inventor: Teng-Yen Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 28 days.

(21) Appl. No.: 16/689,462

(22) Filed: Nov. 20, 2019

(65) Prior Publication Data

US 2021/0151387 A1 May 20, 2021

(51) Int. Cl.
*H01L 23/00* (2006.01)
*H01L 21/66* (2006.01)
*H01L 21/768* (2006.01)

(52) U.S. Cl.
CPC ...... *H01L 23/562* (2013.01); *H01L 21/76877* (2013.01); *H01L 22/12* (2013.01); *H01L 22/34* (2013.01)

(58) Field of Classification Search
None
See application file for complete search history.

(56) References Cited

U.S. PATENT DOCUMENTS

| 2019/0265291 | A1  | 8/2019  | Kwon et al. |
| 2019/0355672 | A1* | 11/2019 | Fujita ................ H01L 27/11524 |
| 2021/0118813 | A1* | 4/2021  | Ho ........................ H01L 23/642 |

FOREIGN PATENT DOCUMENTS

| JP | 2011187576 A   | 9/2011  |
| TW | 202044529 A    | 12/2020 |
| WO | 2015028213 A1  | 3/2015  |

OTHER PUBLICATIONS

Notice of Allowance dated Jan. 25, 2021 related to Taiwanese Application No. 109129286.

* cited by examiner

*Primary Examiner* — Zandra V Smith
*Assistant Examiner* — Lawrence C Tynes, Jr.
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate; a first crack-detecting structure positioned in the substrate and including a first insulating stack inwardly positioned in the substrate, a first bottom conductive layer positioned on the first insulating stack, and a first filler layer positioned on the first bottom conductive layer; and a second crack-detecting structure positioned adjacent to the first crack-detecting structure and including a second insulating stack inwardly positioned in the substrate, a second bottom conductive layer positioned on the second insulating stack, and a second filler layer positioned on the second bottom conductive layer.

19 Claims, 29 Drawing Sheets

SEMICONDUCTOR DEVICE WITH CRACK-DETECTING STRUCTURE AND METHOD FOR FABRICATING THE SAME

TECHNICAL FIELD

The present disclosure relates to a semiconductor device and a method for fabricating the semiconductor device, and more particularly, to a semiconductor device with a crack-detecting structure and a method for fabricating the semiconductor device with a crack-detecting structure.

DISCUSSION OF THE BACKGROUND

Semiconductor devices are used in a variety of electronic applications, such as personal computers, cellular telephones, digital cameras, and other electronic equipment. During the production and/or operation of the semiconductor devices, cracks can occur and propagate in the semiconductor device. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a first crack-detecting structure positioned in the substrate and including a first insulating stack inwardly positioned in the substrate, a first bottom conductive layer positioned on the first insulating stack, and a first filler layer positioned on the first bottom conductive layer; and a second crack-detecting structure positioned adjacent to the first crack-detecting structure and including a second insulating stack inwardly positioned in the substrate, a second bottom conductive layer positioned on the second insulating stack, and a second filler layer positioned on the second bottom conductive layer.

In some embodiments, the semiconductor device further comprises a plurality of stress-dissipating structures positioned on the substrate and next to the first crack-detecting structure.

In some embodiments, the semiconductor device further comprises a guard structure positioned on the substrate and adjacent to the plurality of stress-dissipating structures.

In some embodiments, the semiconductor device further comprises a recess positioned on the substrate and between the plurality of stress-dissipating structures and the guard structure.

In some embodiments, each of the plurality of stress-dissipating structures comprises a dummy conductive plug positioned on the substrate, and sidewalls of the dummy conductive plug are flat.

The semiconductor device of claim 3, wherein each of the plurality of stress-dissipating structures comprises a dummy switch unit positioned on the substrate and a dummy conductive plug positioned on the dummy switch unit.

In some embodiments, the dummy switch unit comprises a dummy switch unit insulating layer positioned on the substrate, a dummy switch unit bottom conductive layer positioned on the dummy switch unit insulating layer, a plurality of dummy switch unit spacers attached to sidewalls of the dummy switch unit bottom conductive layer and the dummy switch unit insulating layer, and a dummy switch unit top conductive layer positioned on the dummy switch unit bottom conductive layer, wherein the dummy conductive plug is positioned on the dummy switch unit top conductive layer.

In some embodiments, the first crack-detecting structure comprises a first top conductive layer positioned between the first bottom conductive layer and the first filler layer.

In some embodiments, the first bottom conductive layer has a thickness between about 10 angstroms and about 100 angstroms.

In some embodiments, the first top conductive layer has a thickness between about 10 angstroms and about 200 angstroms.

In some embodiments, the first insulating stack comprises a first bottom insulating layer inwardly positioned in the substrate, the second insulating stack comprises a second bottom insulating layer inwardly positioned in the substrate, wherein the first bottom insulating layer has a same thickness as the second bottom insulating layer.

In some embodiments, the first insulating stack comprises a first bottom insulating layer inwardly positioned in the substrate and a first top insulating layer positioned on the first bottom insulating layer, the second insulating stack comprises a second bottom insulating layer inwardly positioned in the substrate, and the first insulating stack has a thickness greater than a thickness of the second insulating stack.

In some embodiments, the semiconductor device further comprises a plurality of doped regions positioned adjacent to the first crack-detecting structure and the second crack-detecting structure.

In some embodiments, each of the plurality of stress-dissipating structures has a rectangular shape and extends along a first direction, wherein the plurality of stress-dissipating structures are separate from each other and lengths of the plurality of stress-dissipating structures are sequentially decreasing along a second direction perpendicular to the first direction.

In some embodiments, widths of the plurality of stress-dissipating structures are the same.

In some embodiments, the semiconductor device further comprises an isolation layer positioned in the substrate, wherein the first crack-detecting structure has a depth deeper than a depth of the isolation layer.

In some embodiments, the guard structure has a square shape.

In some embodiments, the guard structure comprises a guard conductive plug positioned on the substrate and sidewalls of the guard conductive plug are flat.

In some embodiments, the plurality of stress-dissipating structures have an accordant shape and dimension.

Another aspect of the present disclosure provides a method of manufacturing a semiconductor device including providing a substrate including a first trench in the substrate and a second trench next to the first trench; forming a first crack-detecting structure in the first trench, wherein the first crack-detecting structure includes a first insulating stack in the first trench, a first bottom conductive layer on the first insulating stack, and a first filler layer on the first bottom conductive layer; and forming a second crack-detecting structure in the second trench, wherein the second crack-detecting structure includes a second insulating stack in the second trench, a second bottom conductive layer on the second insulating stack, and a second filler layer on the second bottom conductive layer.

Due to the design of the semiconductor device of the present disclosure, it is possible to detect cracks electrically by testing the electrical characteristics, and the efficiency of manufacturing the semiconductor device may be thereby improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
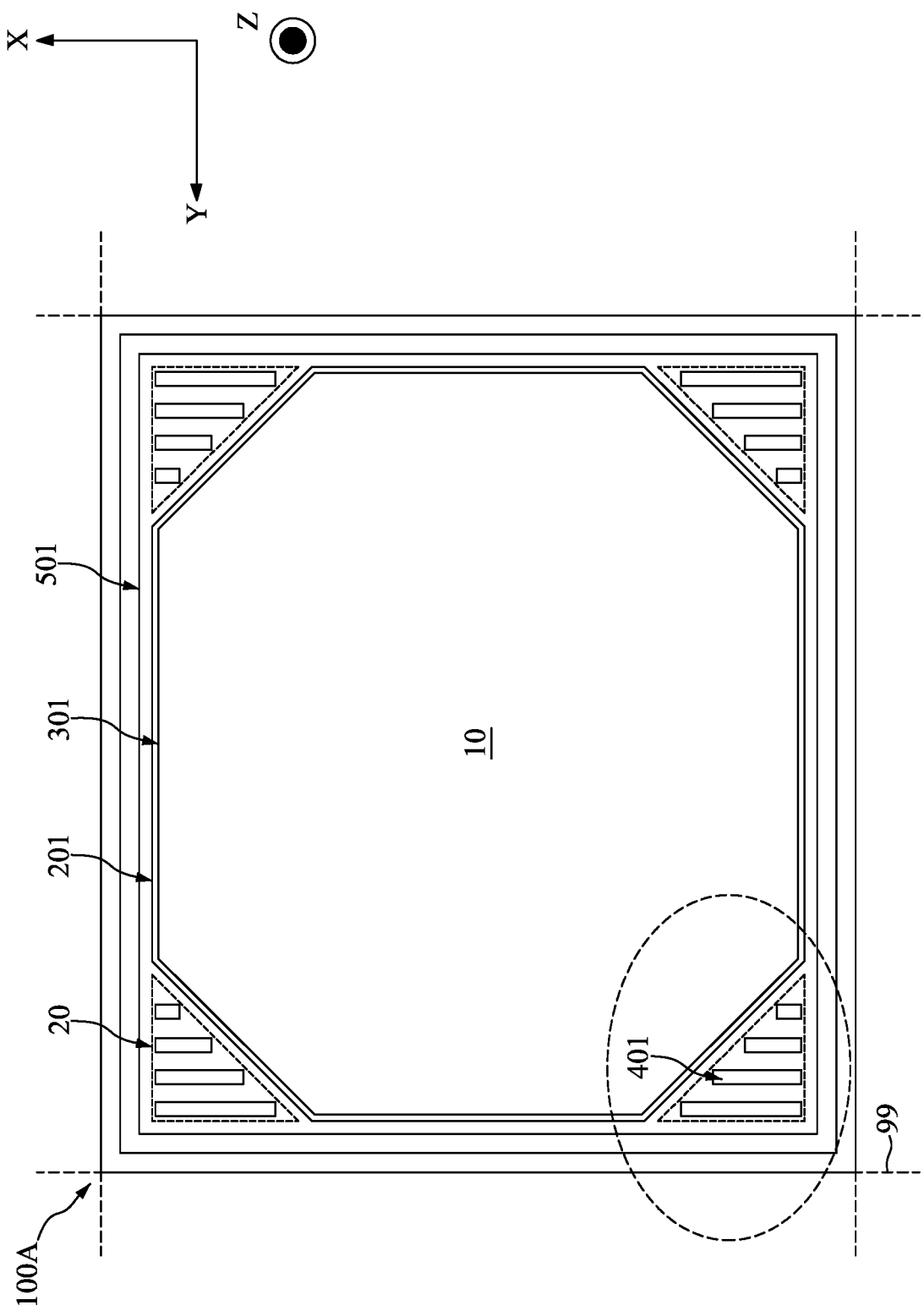
FIG. 1. illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Processes of forming integrated circuit devices may include a die sawing process for cutting a wafer into a plurality of chips. During a die sawing process, a sawing blade may cut a wafer along a scribe line to physically separate the wafer.

Figure 2:
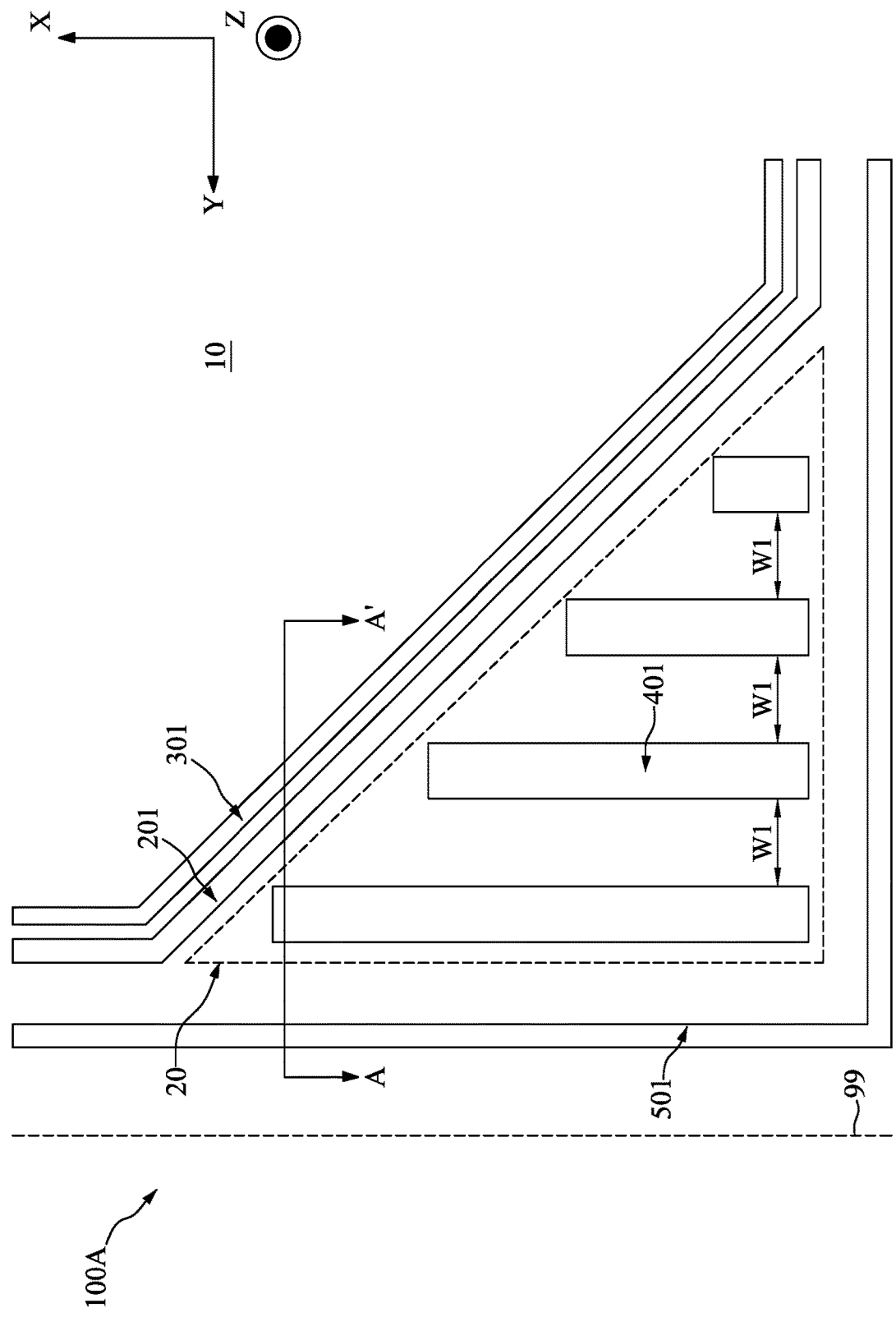
FIG. 2 illustrates, in a schematic zoomed-in top-view diagram, the semiconductor device in accordance with one embodiment of the present disclosure.
Figure 3:
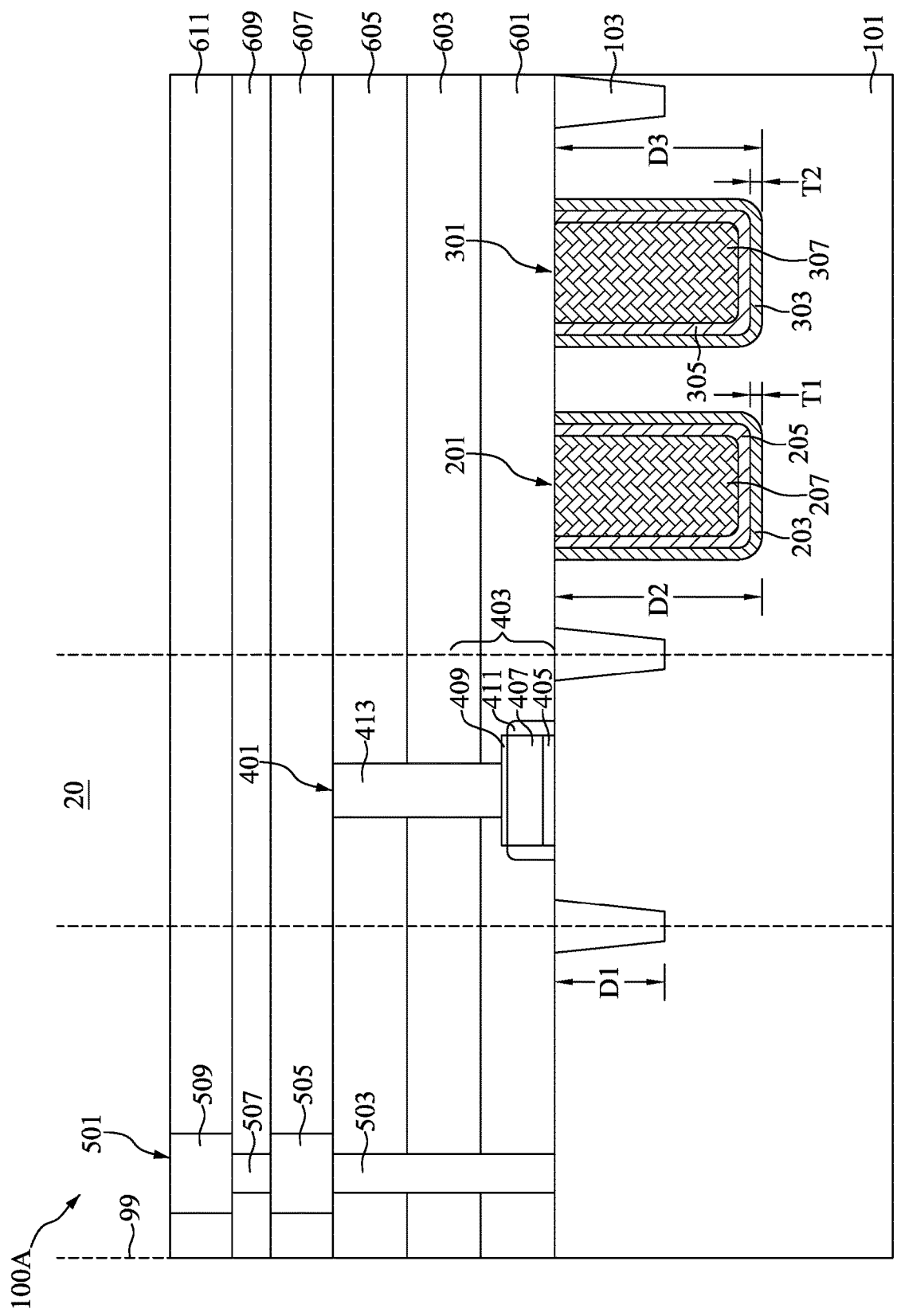
FIG. 3 is a schematic cross-sectional view diagram taken along a line A-A' in FIG. 2.

FIG. 1. illustrates, in a schematic top-view diagram, a semiconductor device 100A in accordance with one embodiment of the present disclosure. FIG. 2 illustrates, in a schematic zoomed-in top-view diagram, the semiconductor device 100A in accordance with one embodiment of the present disclosure. FIG. 3 is a schematic cross-sectional view diagram taken along a line A-A' in FIG. 2.

With reference to FIGS. 1 and 2, in the embodiment depicted, the semiconductor device 100A may be a single chip before a sawing process. A plurality of scribe lines 99 may respectively extend along a first direction X and a second direction Y perpendicular to the first direction X to define edges of the semiconductor device 100A. In other words, the plurality of scribe lines 99 may define a shape of the semiconductor device 100A. In the embodiment depicted, the semiconductor device 100A may have a square shape. The semiconductor device 100A, as seen from a top-view perspective, may include a functional area 10, a plurality of chamfer regions 20, a first crack-detecting structure 201, a second crack-detecting structure 301, a plurality of stress-dissipating structures 401, and a guard structure 501.

With reference to FIGS. 1 and 2, in the embodiment depicted, the functional area 10 may be located at the center of the semiconductor device 100A. A plurality of logic elements and a plurality of storage elements may be disposed at the functional area 10. The second crack-detecting structure 301 may surround the functional area 10. The first crack-detecting structure 201 may surround the second crack-detecting structure 301. The plurality of chamfer regions 20 may be located at corners of the semiconductor device 100A. In the embodiment depicted, the plurality of chamfer regions 20 may be located at four corners of the first crack-detecting structure 201. Specifically, each of the corner portions of the first crack-detecting structure 201 and the second crack-detecting structure 301 may be implemented as a chamfering shape; that is, the first crack-detecting structure 201 and the second crack-detecting structure 301 may have an octagonal shape. The first crack-detecting structure 201 and the second crack-detecting structure 301 may electrically couple to an external signal-sensing device to determine whether cracks exist in the semiconductor device 100A.

With reference to FIGS. 1 and 2, in the embodiment depicted, the plurality of stress-dissipating structures 401 may be located at the plurality of chamfer regions 20. The guard structure 501 may have a square shape and surround the first crack-detecting structure 201 and the plurality of chamfer regions 20. The plurality of chamfer regions 20 may be located between the first crack-detecting structure 201 and the guard structure 501. That is, shapes or regions of the plurality of chamfer regions 20 may be defined by the first crack-detecting structure 201 and the guard structure 501. The guard structure 501 may be located next to the plurality of scribe lines 99.

With reference to FIGS. 1 and 2, in the embodiment depicted, the plurality of stress-dissipating structures 401 may be located next to the first crack-detecting structure 201. Each of the plurality of stress-dissipating structures 401 may have a rectangular shape from a top-view perspective. The plurality of stress-dissipating structures 401 may extend along the first direction X and may be separate from each other. Lengths of the plurality of stress-dissipating structures 401 may be sequentially decreased along the second direction Y. Adjacent pairs of the plurality of stress-dissipating structures 401 may be separated along the second direction Y by a distance W1. Widths of the plurality of stress-dissipating structures 401 may be the same.

With reference to FIG. 3, in the embodiment depicted, the semiconductor device 100A, as viewed from a cross-sectional perspective, may include a substrate 101, an isolation layer 103, the first crack-detecting structure 201, the second crack-detecting structure 301, the plurality of stress-dissipating structures 401 (only one is shown in the cross-sectional diagram in FIG. 3), and the guard structure 501. The substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may be formed of, for example, an insulating material such as silicon oxide, silicon nitride, silicon oxynitride, silicon nitride oxide, or fluoride-doped silicate. The isolation layer 103 may be disposed in the substrate 101. The isolation layer 103 may be formed of, for example, an insulating material such as silicon oxide, silicon nitride, silicon oxynitride, silicon nitride oxide, or fluoride-doped silicate. The isolation layer 103 may have a first depth D1.

With reference to FIG. 3, in the embodiment depicted, the plurality of insulating films may be stacked films including, from bottom to top, a first insulating film 601, a second insulating film 603, a third insulating film 605, a fourth insulating film 607, a fifth insulating film 609, and a sixth insulating film 611. The plurality of insulating films may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 3, in the embodiment depicted, the first crack-detecting structure 201 may be disposed in the substrate 101. The first crack-detecting structure 201 may have a second depth D2. The second depth D2 of the first crack-detecting structure 201 may be greater than the first depth D1 of the isolation layer 103. The first crack-detecting structure 201 may include a first insulating stack, a first bottom conductive layer 205, and a first filler layer 207. The first insulating stack may be inwardly disposed in the substrate 101. The first insulating stack may have a first thickness T1. The first insulating stack may include a first bottom insulating layer 203. The first bottom insulating layer 203 may be inwardly disposed in the substrate 101 and have the same first thickness T1. The first thickness T1 may be between about 0.5 nm and about 5.0 nm. Preferably, the first thickness T1 may be between about 0.5 nm and about 2.5 nm. It should be noted that the first thickness T1 may be set to an arbitrary range depending on the circumstances.

The first bottom insulating layer 203 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

With reference to FIG. 3, in the embodiment depicted, the first bottom conductive layer 205 may be disposed on the first bottom insulating layer 203. The first bottom conductive layer 205 may have a thickness between about 10 angstroms and about 200 angstroms. Preferably, the thickness of the first bottom conductive layer 205 may be between about 10 angstroms and about 100 angstroms. The first bottom conductive layer 205 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The first filler layer 207 may be disposed on the first bottom conductive layer 205. A top surface of the first filler layer 207 may be even with a top surface of the substrate 101. The first filler layer 207 may be formed of, for example, tungsten or aluminum.

With reference to FIG. 3, in the embodiment depicted, the second crack-detecting structure 301 may be disposed in the substrate 101 and adjacent to the first crack-detecting structure 201. The second crack-detecting structure 301 may have a third depth D3. The third depth D3 may be greater than the first depth D1 of the isolation layer 103. In the embodiment depicted, the third depth D3 of the second crack-detecting structure 301 may be the same as the second depth D2 of the first crack-detecting structure 201. Alternatively, in another embodiment, the third depth D3 of the second crack-detecting structure 301 may be different from the second depth D2 of the first crack-detecting structure 201.

With reference to FIG. 3, in the embodiment depicted, the second crack-detecting structure 301 may include a second insulating stack, a second bottom conductive layer 305, and a second filler layer 307. The second insulating stack may be inwardly disposed in the substrate 101 and adjacent to the first insulating stack. The second insulating stack may have a second thickness T2. In the embodiment depicted, the second thickness T2 may be the same as the first thickness T1. The second insulating stack may include a second bottom insulating layer 303. The second bottom insulating layer 303 may be inwardly disposed in the substrate 101 and have the same second thickness T2. The second bottom insulating layer 303 may be formed of a same material as the first bottom insulating layer 203, but is not limited thereto.

With reference to FIG. 3, in the embodiment depicted, the second bottom conductive layer 305 may be disposed on the second bottom insulating layer 303. The second bottom conductive layer 305 may have a same thickness as the first bottom conductive layer 205, but is not limited thereto. The second bottom conductive layer 305 may be formed of a same material as the first bottom conductive layer 205, but is not limited thereto. The second filler layer 307 may be disposed on the second bottom conductive layer 305. A top surface of the second filler layer 307 may be even with the top surface of the substrate 101. The second filler layer 307 may be formed of a same material as the first filler layer 207, but is not limited thereto.

With reference to FIG. 3, in the embodiment depicted, each of the plurality of stress-dissipating structures 401 may include a dummy switch unit 403 and a first dummy conductive line 413. The dummy switch unit 403 may be disposed on the substrate 101 and in the first insulating film 601. The first dummy conductive line 413 may be disposed on the dummy switch unit 403 and in the third insulating film 605, the second insulating film 603, and the first insulating film 601. The dummy switch unit 403 may include a dummy switch unit insulating layer 405, a dummy switch unit bottom conductive layer 407, a dummy switch unit top conductive layer 409, and a plurality of dummy switch unit spacers 411.

With reference to FIG. 3, in the embodiment depicted, the dummy switch unit insulating layer 405 may be disposed on the substrate 101 and in the first insulating film 601. The dummy switch unit insulating layer 405 may be formed of a same material as the first bottom insulating layer 203, but is not limited thereto. The dummy switch unit bottom conductive layer 407 may be disposed on the dummy switch unit insulating layer 405 and in the first insulating film 601. The dummy switch unit bottom conductive layer 407 may be formed of, for example, doped polysilicon. The plurality of dummy switch unit spacers 411 may be attached to sidewalls of the dummy switch unit insulating layer 405 and sidewalls of the dummy switch unit bottom conductive layer 407. The plurality of dummy switch unit spacers 411 may be formed of, for example, polysilicon, silicon oxide, or silicon nitride. The dummy switch unit top conductive layer 409 may be disposed on the dummy switch unit bottom conductive layer 407 and in the plurality of dummy switch unit spacers 411. The dummy switch unit top conductive layer 409 may be formed of, for example, metal silicide. The metal silicide may be nickel silicide, platinum silicide, titanium silicide, molybdenum silicide, cobalt silicide, tantalum silicide, tungsten silicide, or the like.

With reference to FIG. 3, in the embodiment depicted, the first dummy conductive line 413 may be disposed on the dummy switch unit top conductive layer 409 and extend through the third insulating film 605, the second insulating film 603, and the first insulating film 601. The first dummy conductive line 413 may be formed of, for example, doped polysilicon, titanium, titanium nitride, tantalum, tantalum nitride, tungsten, copper, aluminum or aluminum alloy. Sidewalls of the dummy conductive line 413 may be flat.

During the sawing process, stress due to the sawing process along the first direction X and stress due to the sawing process along the second direction Y may accumulate in corner portions of the semiconductor device 100A. Thus, cracks may occur in the corner portions of the semiconductor device 100A more frequently than in other portions of the semiconductor device 100A. With the presence of the plurality of stress-dissipating structures 401 located at the plurality of chamfer regions 20, the stresses accumulated in the corner portions of the semiconductor device 100A may be dissipated. Hence, a reliability of the semiconductor device 100A may be improved. In addition, the plurality of stress-dissipating structures 401 may reduce a loading effect during etch processes of fabricating the semiconductor device 100A.

With reference to FIG. 3, in the embodiment depicted, the guard structure 501 may be disposed within the plurality of insulating films and may include a guard conductive plug 503, a guard first conductive layer 505, a guard first conductive via 507, and a guard second conductive layer 509. The guard conductive plug 503 may be disposed on the substrate 101 and next to the plurality of stress-dissipating structures 401. The guard conductive plug 503 may be disposed extending through the third insulating film 605, the second insulating film 603, and the first insulating film 601. A top surface of the guard conductive plug 503 may be even with top surfaces of the plurality of dummy conductive plugs 413. The guard conductive plug 503 may be formed of a same material as the plurality of dummy conductive plugs 413, but is not limited thereto.

With reference to FIG. 3, in the embodiment depicted, the guard first conductive layer 505 may be disposed on the guard conductive plug 503 and in the fourth insulating film 607. The guard first conductive layer 505 may be formed of a same material as the plurality of dummy conductive plugs 413, but is not limited thereto. The guard first conductive via 507 may be disposed on the guard first conductive layer 505 and in the fifth insulating film 609. The guard first conductive via 507 may be formed of a same material as the plurality of dummy conductive plugs 413, but is not limited thereto. The guard second conductive layer 509 may be disposed on the guard first conductive via 507 and in the sixth insulating film 611. The guard second conductive layer 509 may be formed of a same material as the plurality of dummy conductive plugs 413, but is not limited thereto.

With reference to FIG. 3, in the embodiment depicted, widths of the guard second conductive layer 509 and the guard first conductive layer 505 may be greater than widths of the guard conductive plug 503 or the guard first conductive via 507. Hence, the guard second conductive layer 509 or the guard first conductive layer 505 may have protruding portions compared to the guard first conductive via 507 or the guard conductive plug 503. The guard structure 501 may serve as a physical buffer that allow the dissipation of energy or stress induced during processes such as the sawing process, a wire bonding process, a soldering process, or during rigorous environmental testing.

Figure 4:
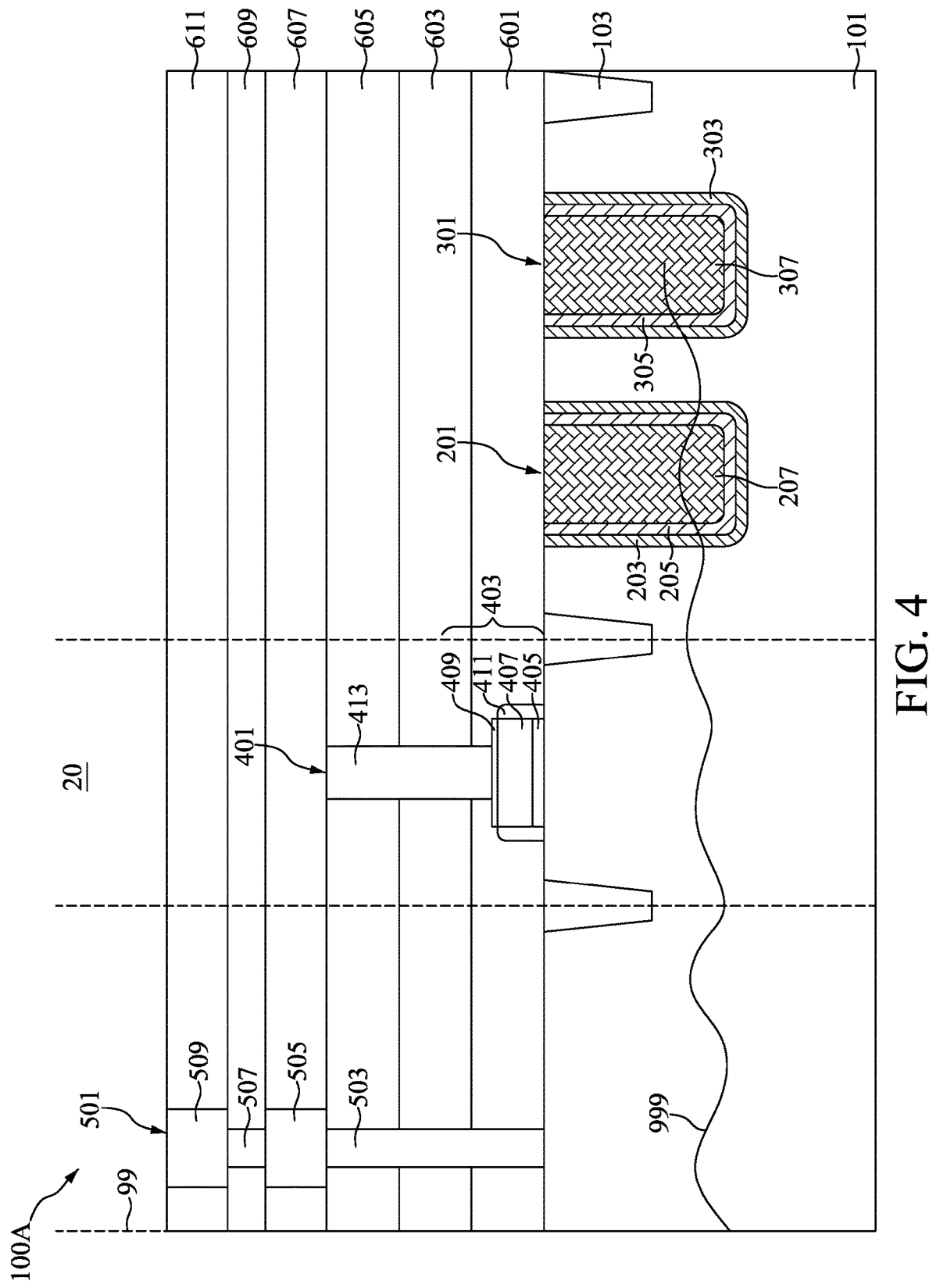
FIG. 4 illustrates, in a schematic cross-sectional view diagram, the semiconductor device including a crack in accordance with an embodiment of the present disclosure.
Figure 5:
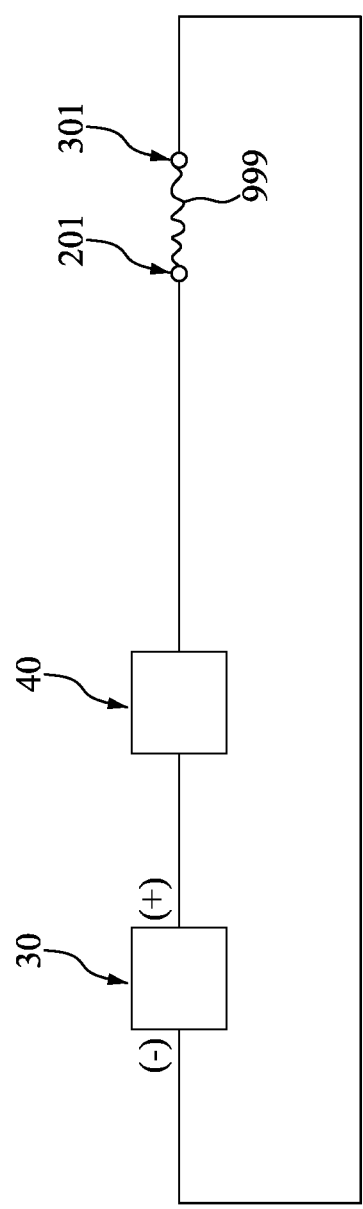
FIG. 5 illustrates, in a schematic circuit diagram, a semiconductor device with a crack in accordance with an embodiment of the present disclosure.

FIG. 4 illustrates, in a schematic cross-sectional view diagram, the semiconductor device 100A including a crack 999 in accordance with an embodiment of the present disclosure. FIG. 5 illustrates, in a schematic circuit diagram, a semiconductor device with a crack 999 in accordance with an embodiment of the present disclosure. The semiconductor device is coupled to an external voltage source 30 and an external signal-sensing device 40.

With reference to FIGS. 3 to 5, the external signal-sensing device 40 may be electrically coupled to the first crack-detecting structure 201 through the first filler layer 207. The external signal-sensing device 50 may be a current detector or an impedance detector. One end of the external voltage source 30 may be electrically coupled to the first crack-detecting structure 201 through the external signal-sensing device 40. Another end of the external voltage source 30 may be electrically coupled to the second crack-detecting structure 301 through the second filler layer 307. Without the presence of cracks as in FIG. 3, the first crack-detecting structure 201 and the second crack-detecting structure 301 may be electrically insulated by the first bottom insulating layer 203 and the second bottom insulating layer 303; therefore, no signal can be read from the external signal-sensing device 40. In contrast, as in FIGS. 4 and 5, when a crack 999 is propagating toward the functional area 10 and extends through the first crack-detecting structure 201 and the second crack-detecting structure 301, the crack 999 may form a pathway electrically connecting the first bottom conductive layer 205, first filler layer 207, the second bottom conductive layer 305, and the second filler layer 307. As a result, a signal can be read through the external signal-sensing device 40.

FIGS. 6 to 9 illustrate, in schematic cross-sectional view diagrams, semiconductor devices 100B, 100C, 100D and 100E in accordance with other embodiments of the present disclosure.

Figure 6:
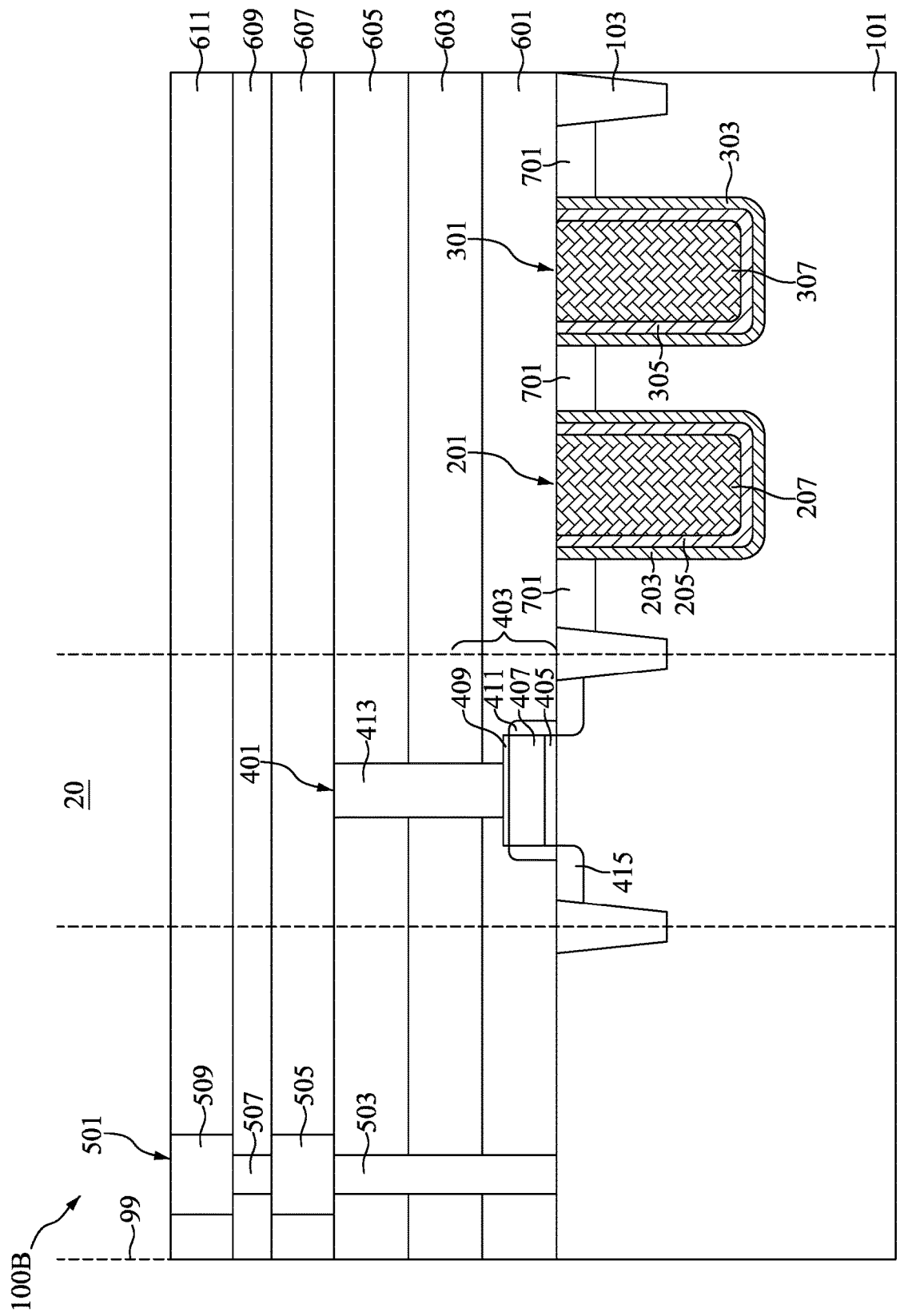
FIGS. 6 to 9 illustrate, in schematic cross-sectional view diagrams, semiconductor devices in accordance with other embodiments of the present disclosure.

With reference to FIG. 6, the semiconductor device 100B may include a plurality of doped regions 701. The plurality of doped regions 701 may be disposed adjacent to the first crack-detecting structure 201 and the second crack-detecting structure 301. Specifically, the plurality of doped regions 701 may be respectively correspondingly disposed between the first crack-detecting structure 201 and the second crack-detecting structure 301, between the first crack-detecting structure 201 and the isolation layer 103, and between the second crack-detecting structure 301 and the isolation layer 103. The plurality of doped regions 701 may be doped with a dopant such as phosphorus, arsenic, boron, or antimony.

Figure 7:
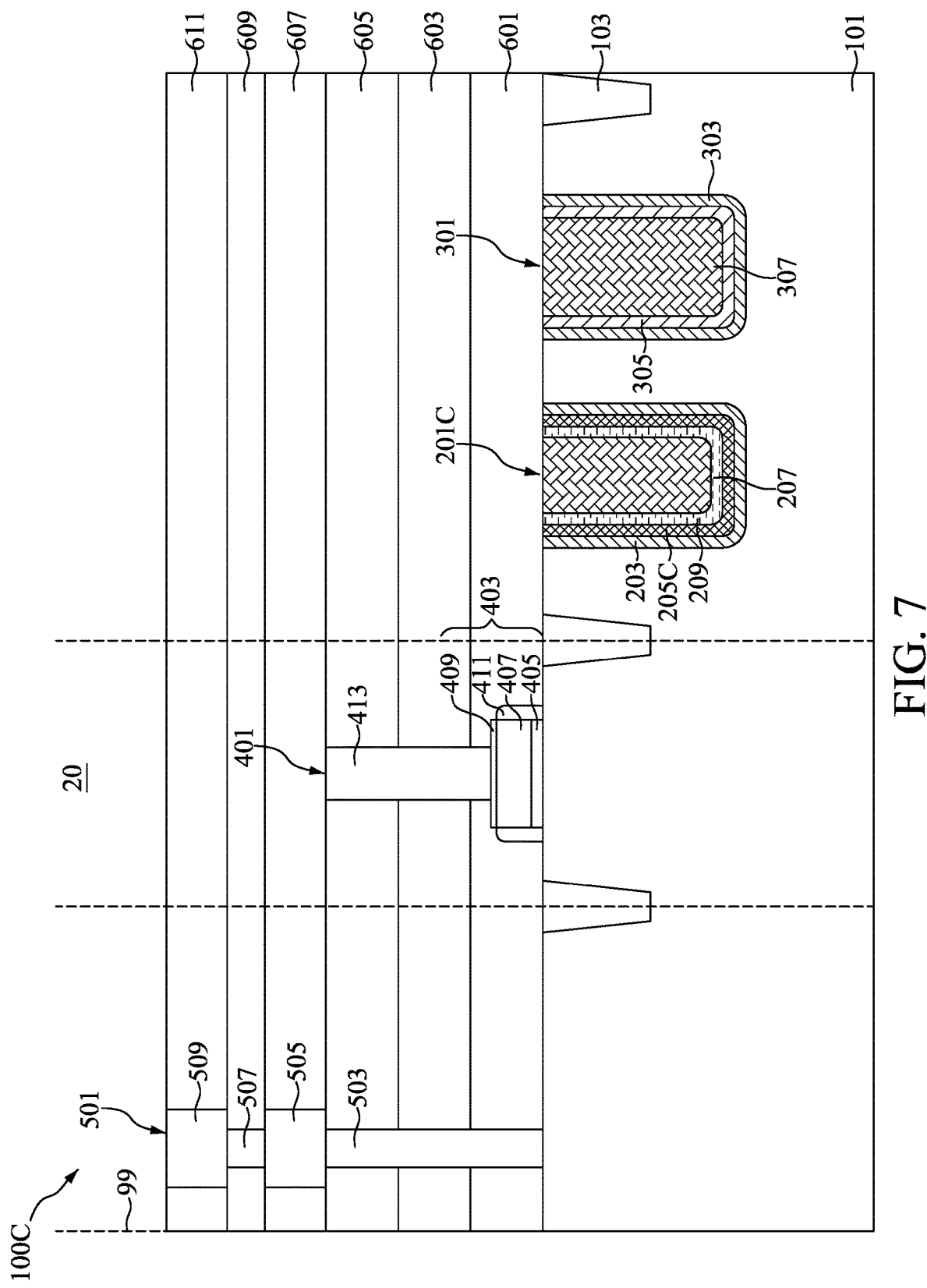

With reference to FIG. 7, in the semiconductor device 100C, the first crack-detecting structure 201C may include a first top conductive layer 209. The first top conductive layer 209 may be disposed between the first bottom conductive layer 205C and the first filler layer 207. The first bottom conductive layer 205C may have a thickness between about 10 angstroms and about 100 angstroms. The first bottom conductive layer 205C may be formed of, for example, titanium nitride, tantalum nitride, tantalum carbide, tungsten nitride, or ruthenium. The first top conductive layer 209 may have a thickness between about 10 angstroms and about 200 angstroms. Preferably, the thickness of the first top conductive layer 209 may be between about 10 angstroms and about 100 angstroms. The first top conductive layer 209 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

Figure 8:
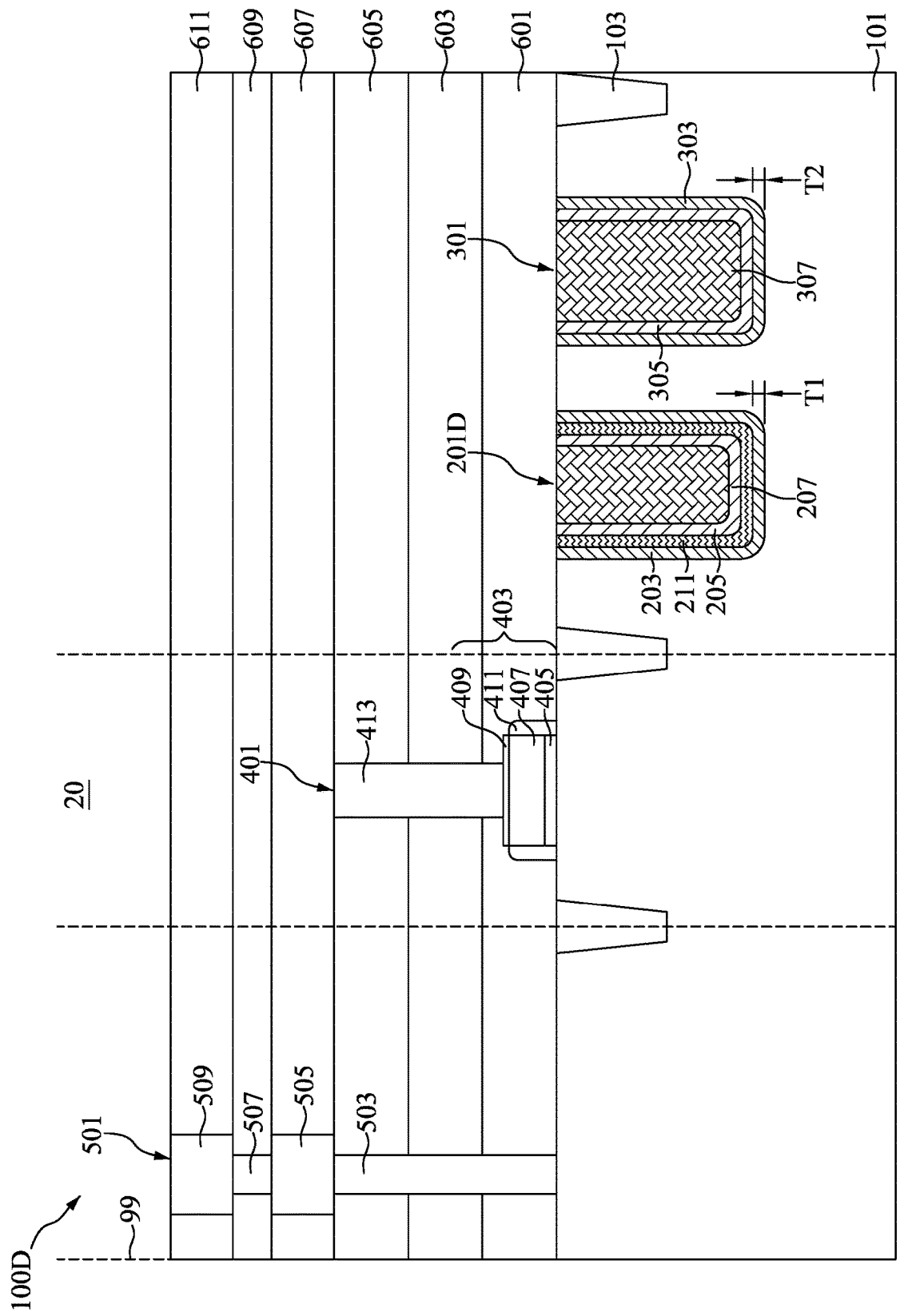

With reference to FIG. 8, in the semiconductor device 100D, the first thickness T1 of the first insulating stack may be greater than the second thickness of the second insulating stack T2. The first insulating stack may include a first bottom insulating layer 203 and a first top insulating layer 211. The first bottom insulating layer 203 may be inwardly disposed in the substrate 101. The first top insulating layer 211 may be disposed on the first bottom insulating layer 203. The first bottom conductive layer 205 may be disposed on the first top insulating layer 211. The first top insulating layer 211 may have a thickness between about 0.1 nm and about 2.0 nm. Preferably, the thickness of the first top insulating layer 211 may be between about 0.5 nm to about 1.5 nm. It should be noted that the thickness of the first top insulating layer 211 may be set to an arbitrary range depending on the circumstances. The first top insulating layer 211 may be formed of, for example, an insulating material having a dielectric constant of about 4.0 or greater. Alternatively, in another embodiment, the first top insulating layer 211 may be formed of, for example, silicon oxide, silicon nitride, silicon oxynitride, silicon nitride oxide, or the like.

Figure 9:
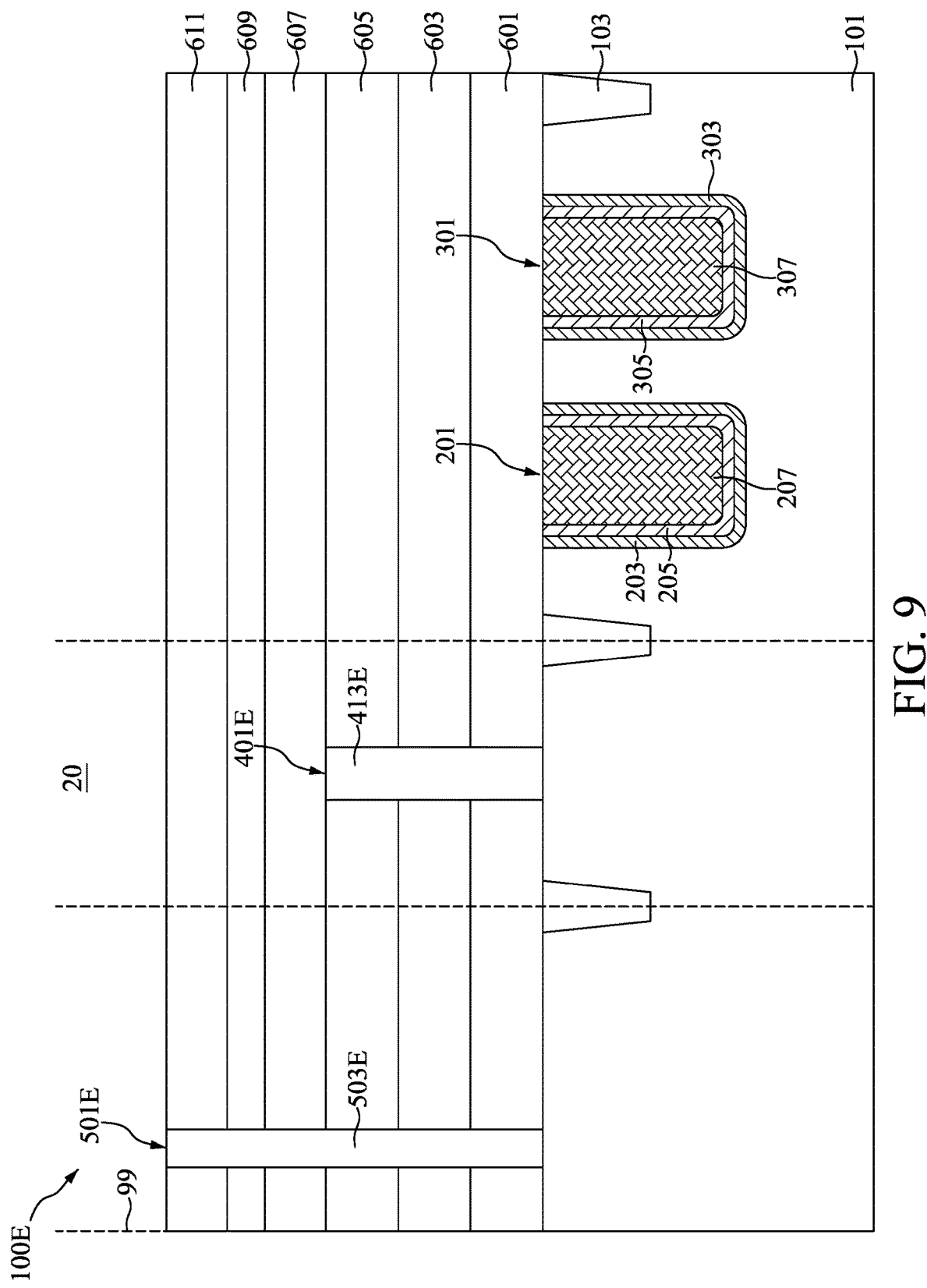

With reference to FIG. 9, in the semiconductor device 100E, each of the plurality of stress-dissipating structures 401E may include only the first dummy conductive line 413E disposed on the substrate 101. The first dummy conductive line 413E may be disposed extending through the third insulating film 605, the second insulating film 603 and the first insulating film 601. Forming the plurality of stress-dissipating structures 401E including only the first dummy conductive line 413E may reduce a complexity of the fabricating process of the semiconductor device 100E. The guard structure 501E may include only the guard conductive plug 503E disposed on the substrate 101. The guard conductive plug 503E may be disposed extending through the sixth insulating film 611, the fifth insulating film 609, the fourth insulating film 607, the third insulating film 605, the second insulating film 603, and the first insulating film 601. Sidewalls of the guard conductive plug 503E may be flat. The flat sidewalls of the guard conductive plug 503E may not have an adhesion interface of heterogeneous materials originating from protruding portions disposed on the sidewalls of the guard structure 501 as shown in FIG. 3. Hence, the guard structure 501E having the flat sidewalls may block a propagating crack more effectively.

Figure 10:
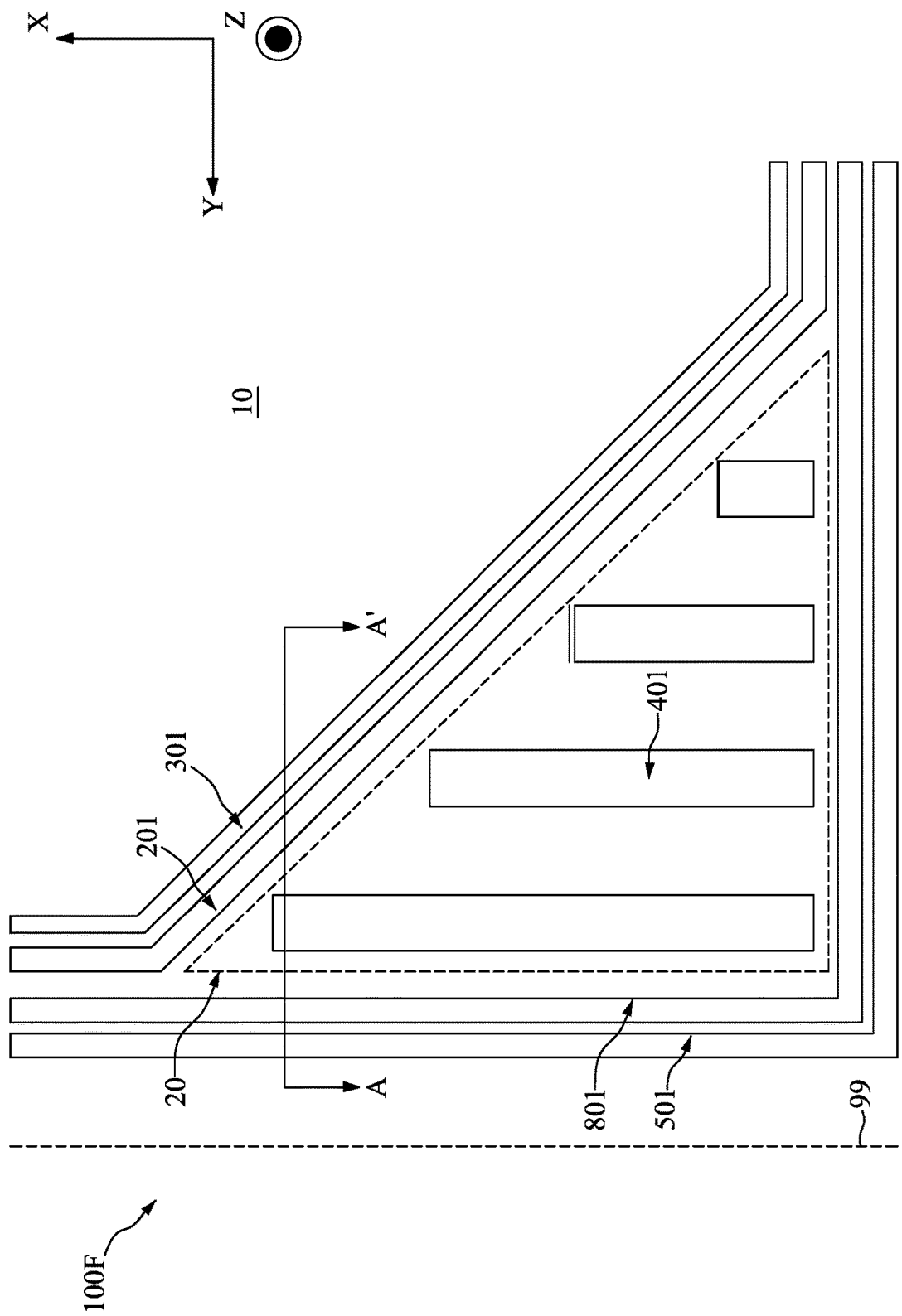
FIG. 10 illustrates, in a schematic zoomed-in top-view diagram, a semiconductor device in accordance with another embodiment of the present disclosure.
Figure 11:
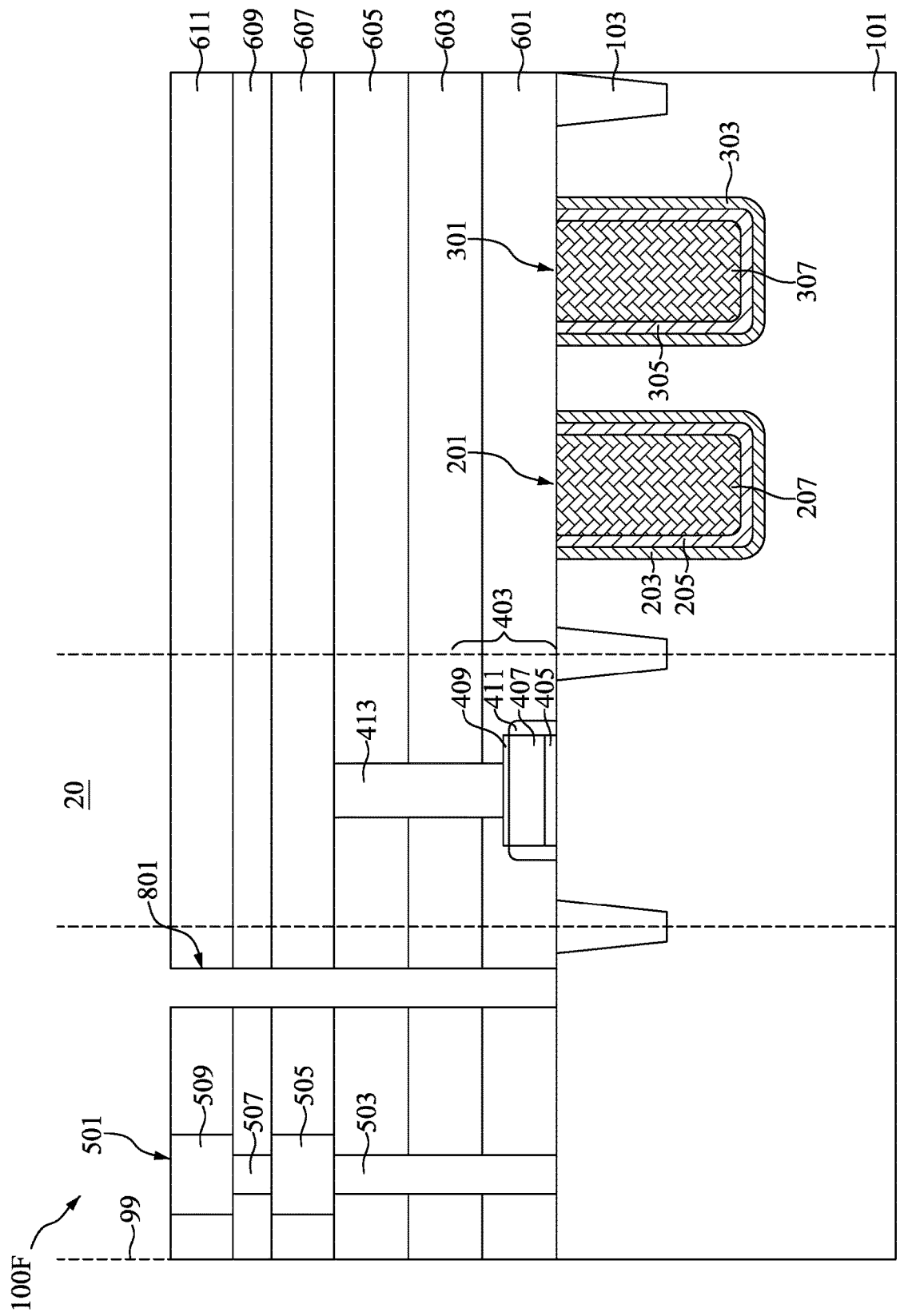
FIG. 11 is a schematic cross-sectional view diagram taken along a line A-A' in FIG. 10.

FIG. 10 illustrates, in a schematic zoomed-in top-view diagram, a semiconductor device 100F in accordance with another embodiment of the present disclosure. FIG. 11 is a schematic cross-sectional view diagram taken along a line A-A' in FIG. 10.

With reference to FIGS. 10 and 11, the semiconductor device 100F may include a recess 801. The recess 801 may have a square profile from a top-view perspective and may surround the first crack-detecting structure 201 and the plurality of chamfer regions 20 from a top-view perspective. The recess 801 may be disposed on the substrate 101 and between the plurality of stress-dissipating structures 401 and the guard structure 501. The recess 801 may be disposed penetrating through the recess 801, the fifth insulating film 609, the fourth insulating film 607, the third insulating film 605, the second insulating film 603, and the first insulating film 601. The recess 801 may stop cracks from propagating toward the functional area 10 or reduce the stress of the cracks, especially lateral stress.

Figure 12:
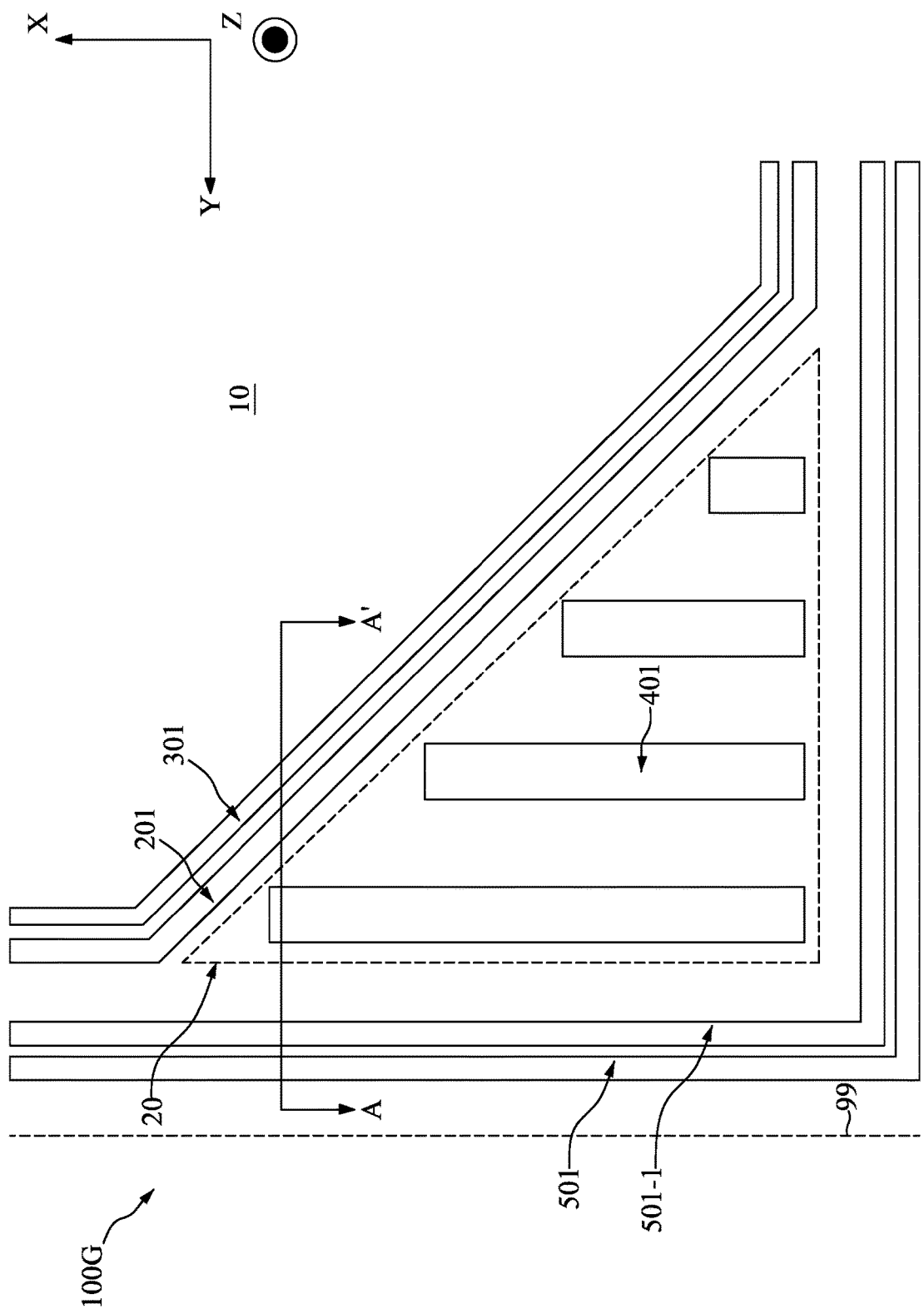
FIG. 12 illustrates, in a schematic zoomed-in top-view diagram, a semiconductor device in accordance with another embodiment of the present disclosure.
Figure 13:
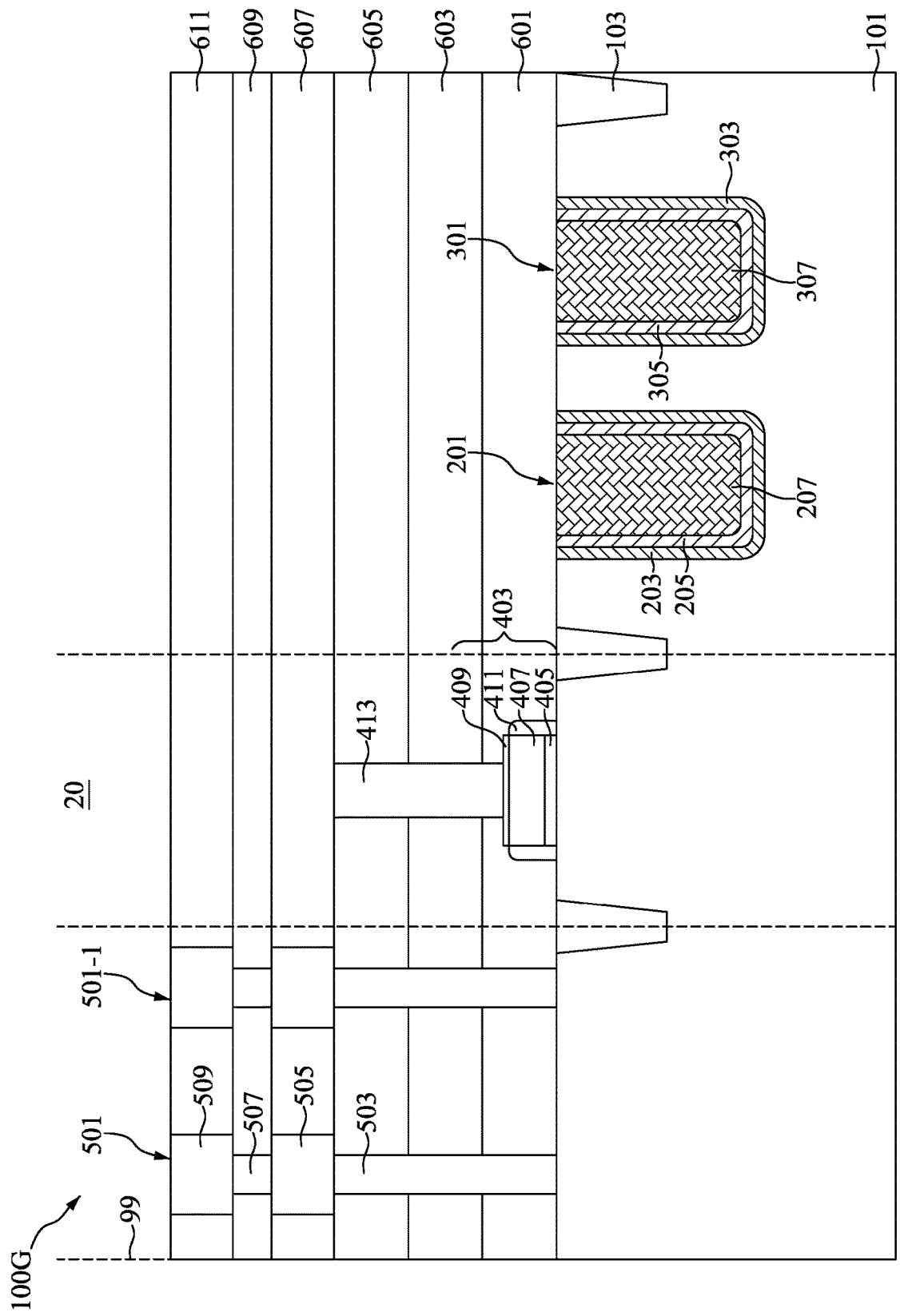
FIG. 13 is a schematic cross-sectional view diagram taken along a line A-A' in FIG. 12.

FIG. 12 illustrates, in a schematic zoomed-in top-view diagram, a semiconductor device 100G in accordance with another embodiment of the present disclosure. FIG. 13 is a schematic cross-sectional view diagram taken along a line A-A' in FIG. 12.

With reference to FIGS. 12 and 13, the semiconductor device 100G may include a second guard structure 501-1. The second guard structure 501-1 may have a square profile from a top view perspective and may surround the first crack-detecting structure 201 and the plurality of chamfer regions 20 from a top-view perspective. The second guard structure 501-1 may be disposed on the substrate 101 and between the plurality of stress-dissipating structures 401 and the guard structure 501. The second guard structure 501-1 may have a structure similar to that of the guard structure 501.

Figure 14:
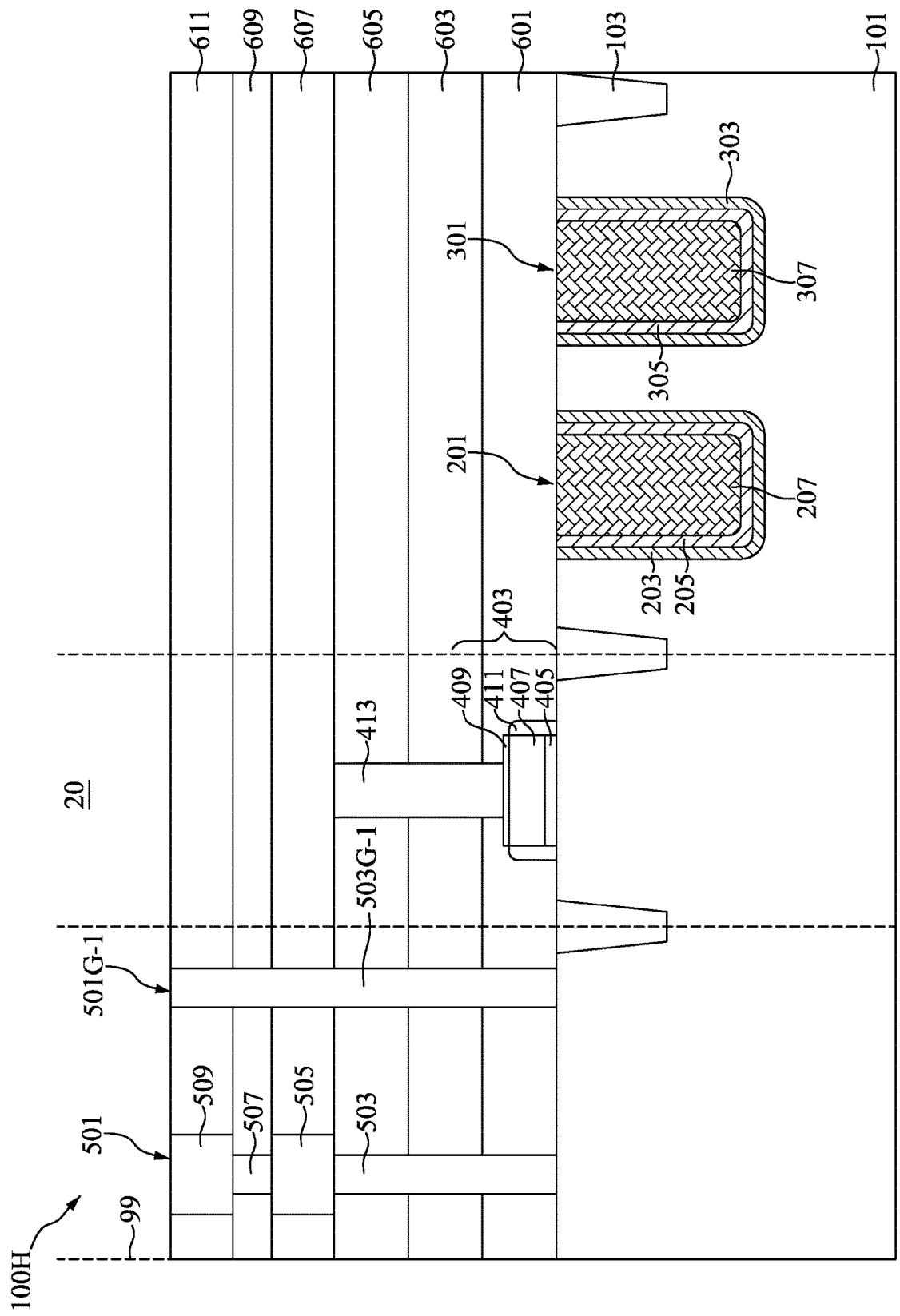
FIG. 14 illustrates, in a schematic cross-sectional view diagram, a semiconductor device in accordance with another embodiment of the present disclosure.

FIG. 14 illustrates, in a schematic cross-sectional view diagram, a semiconductor device 100H in accordance with another embodiment of the present disclosure.

With reference to FIG. 14 and in comparison with FIG. 13, in the semiconductor device 100H, the second guard structure 501G-1 may have a different structure compared to the guard structure 501. The second guard structure 501G-1 may include a guard conductive plug 503G-1. The guard conductive plug 503G-1 may be disposed on the substrate 101 and extending through the sixth insulating film 611, the fifth insulating film 609, the fourth insulating film 607, the third insulating film 605, the second insulating film 603, and the first insulating film 601. Sidewalls of the guard conductive plug 503G-1 may be flat.

Figure 15:
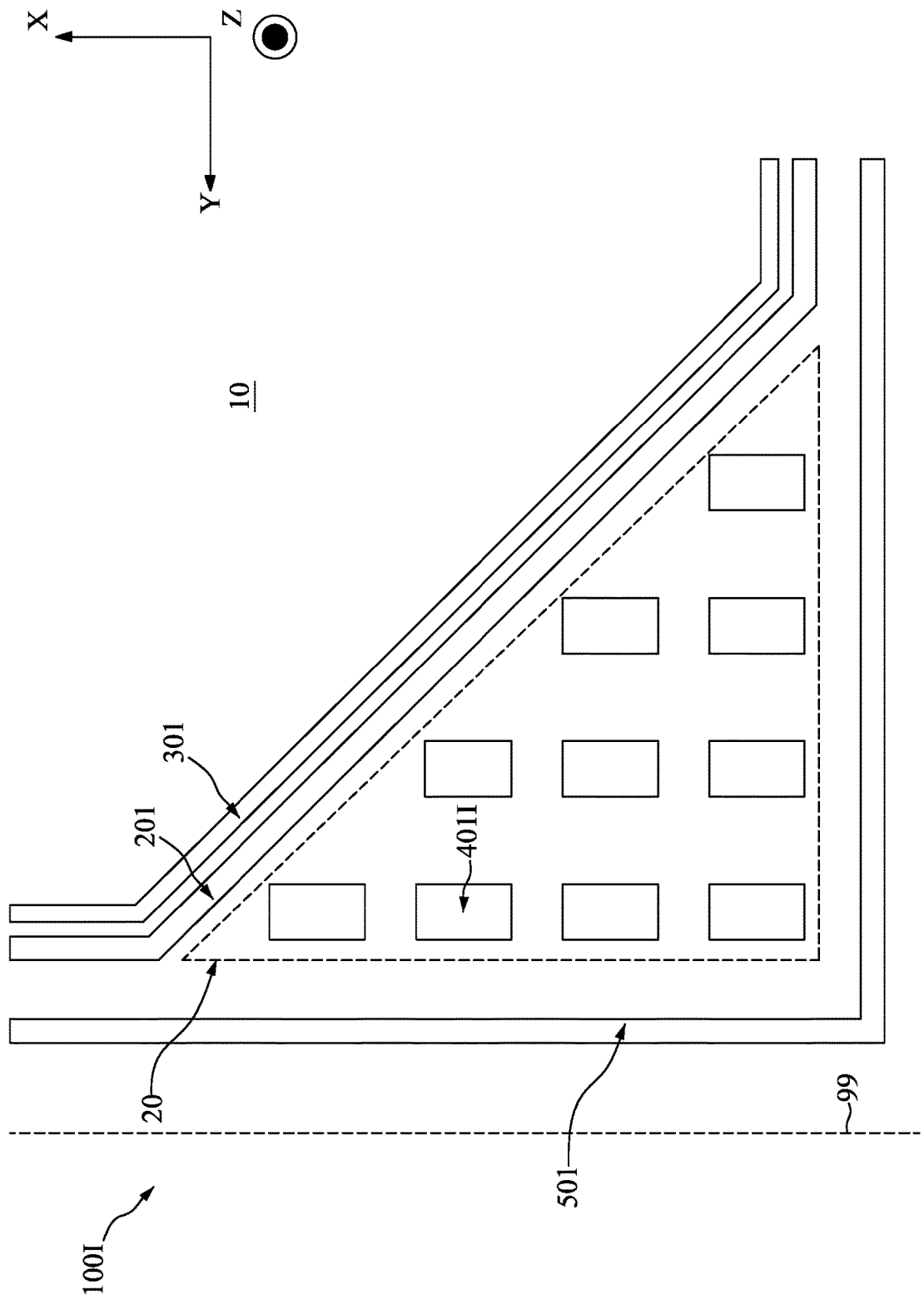
FIGS. 15 and 16 illustrate, in schematic zoomed-in top-view diagrams, semiconductor devices in accordance with other embodiments of the present disclosure.
Figure 16:
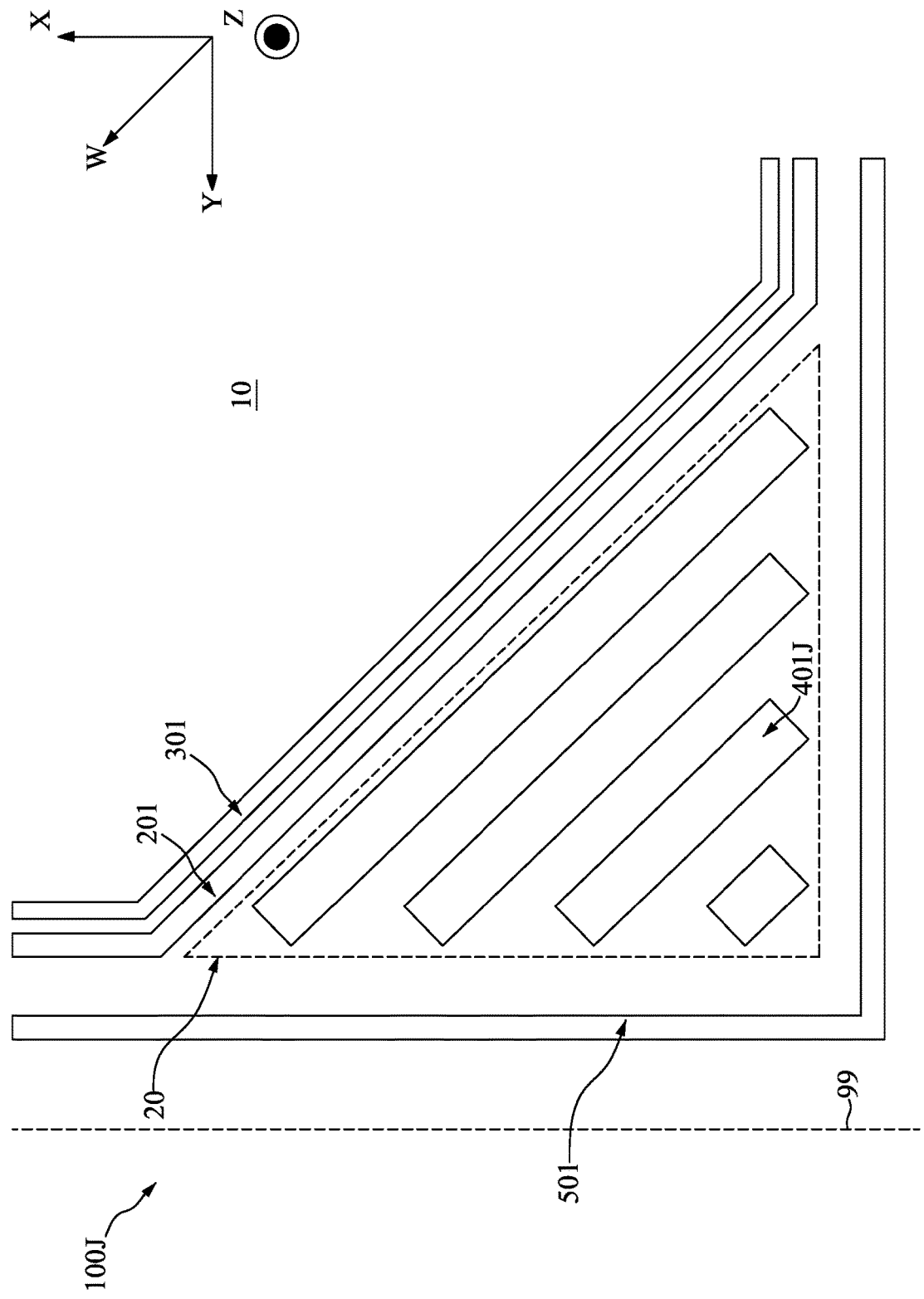

FIGS. 15 and 16 illustrate, in schematic zoomed-in top-view diagrams, semiconductor devices 100I and 100J in accordance with other embodiments of the present disclosure.

With reference to FIG. 15, the plurality of stress-dissipating structures 401I may have an accordant shape and dimension. In the embodiment depicted, the shape may be rectangular. In other words, widths or lengths of the plurality of stress-dissipating structures 401I may be the same. The plurality of stress-dissipating structures 401I may be separate from each other and may be respectively disposed along the first direction X and the second direction Y. Distances between any two adjacent stress-dissipating structures 401I along the first direction X may be the same.

With reference to FIG. 16, each of the plurality of stress-dissipating structures 401J may have a rectangular shape from a top-view perspective. The plurality of stress-dissipating structures 401J may extend along a third direction W diagonal in respect to the first direction X and the second direction Y. Lengths of the plurality of stress-dissipating structures 401J may be sequentially increased along a fourth direction perpendicular to the third direction W.

Figure 17:
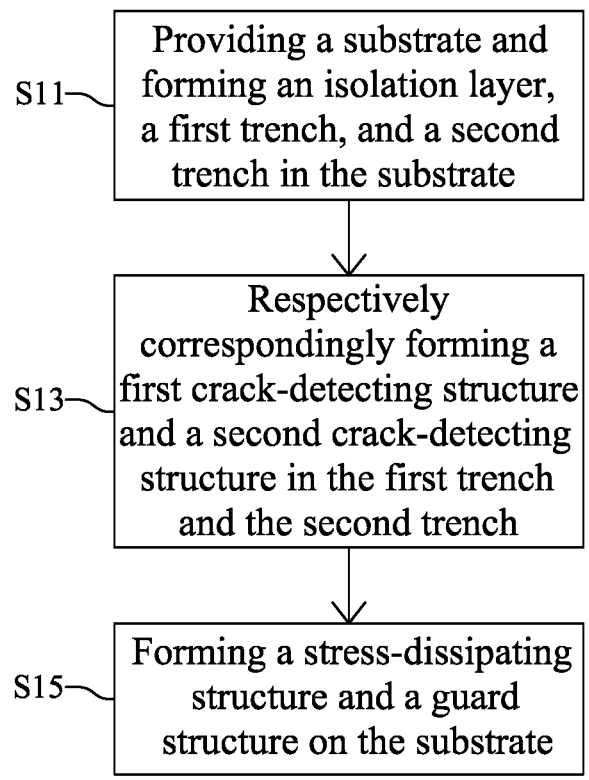
FIG. 17 illustrates, in a flowchart diagram form, a method for fabricating a semiconductor device in accordance with one embodiment of the present disclosure.

FIG. 17 illustrates, in a flowchart diagram form, a method 50 for fabricating a semiconductor device 100A in accordance with one embodiment of the present disclosure. FIGS. 18 to 29 illustrate, in schematic cross-sectional diagrams, a flow of fabricating the semiconductor device 100A in accordance with one embodiment of the present disclosure.

Figure 18:
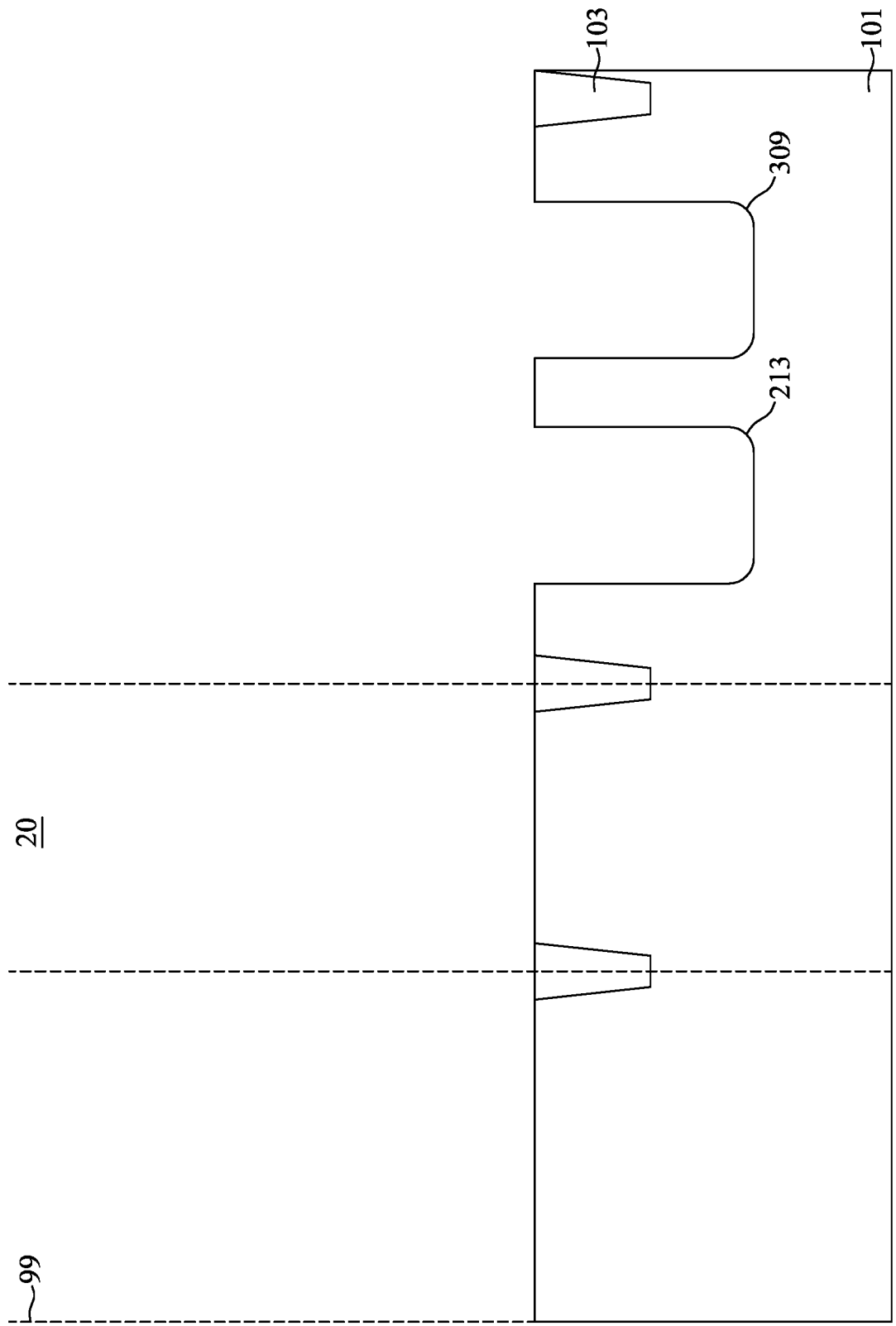
FIGS. 18 to 29 illustrate, in schematic cross-sectional diagrams, a flow of fabricating the semiconductor device in accordance with one embodiment of the present disclosure.

With reference to FIGS. 17 and 18, at step S11, in the embodiment depicted, a substrate 101 may be provided, and an isolation layer 103, a first trench 213, and a second trench 309 may be formed in the substrate 101. The isolation layer 103 may be formed in the substrate 101 by a photolithography process and a subsequent etch process using a hard mask layer. The first trench 213 and the second trench 309 may be formed next to each other.

Figure 19:
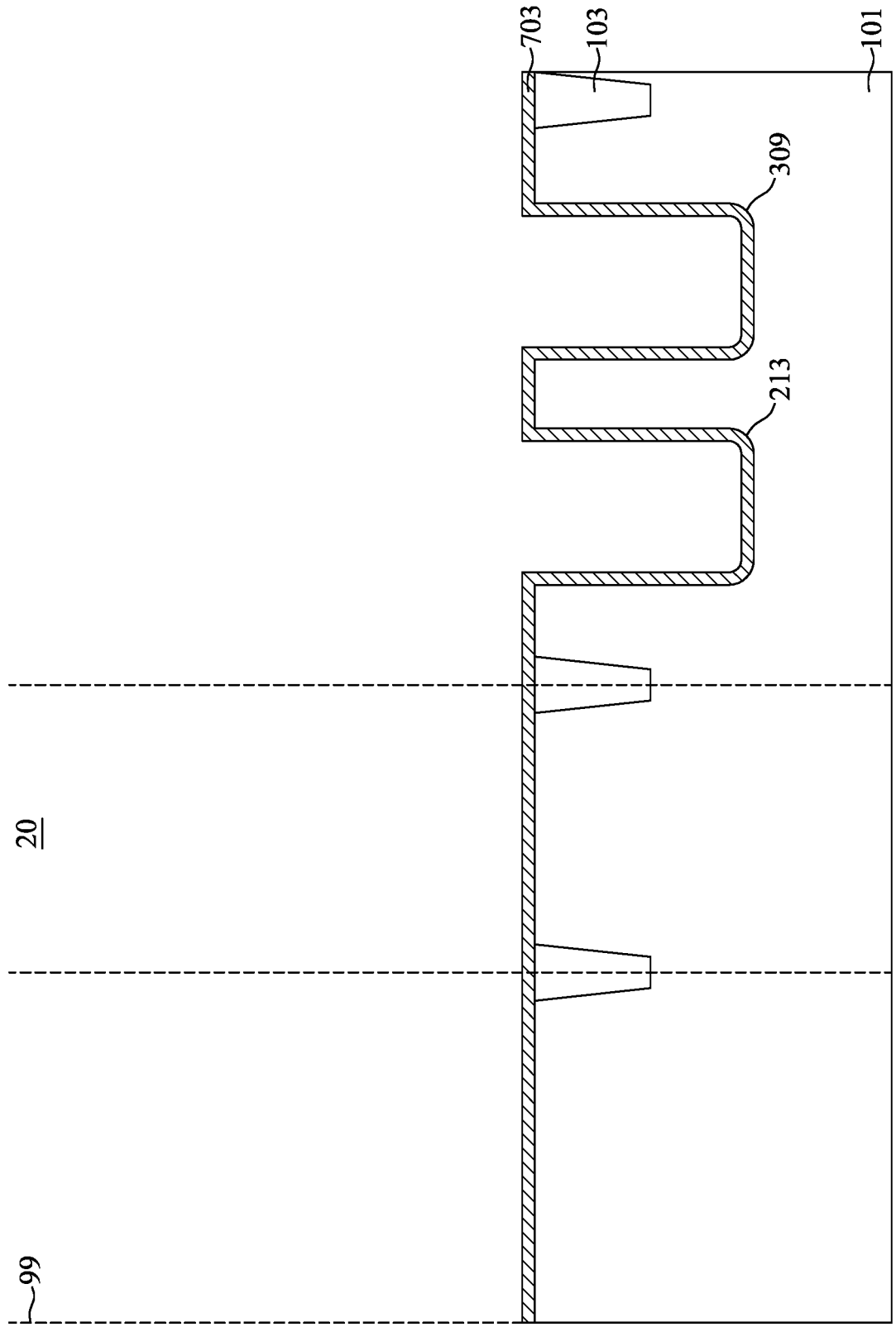

With reference to FIGS. 17 and 19 to 25, at step S13, in the embodiment depicted, a first crack-detecting structure 201 and a second crack-detecting structure 301 may be respectively correspondingly formed in the first trench 213 and the second trench 309. With reference to FIG. 19, a bottom insulating film 703 may be deposited over the substrate 101, the first trench 213, and the second trench 309. The bottom insulating film 703 may have a thickness between about 0.5 nm and about 5.0 nm. The bottom insulating film 703 may be formed of, for example, an insulating material having a dielectric constant of about 4.0 or greater.

Figure 20:
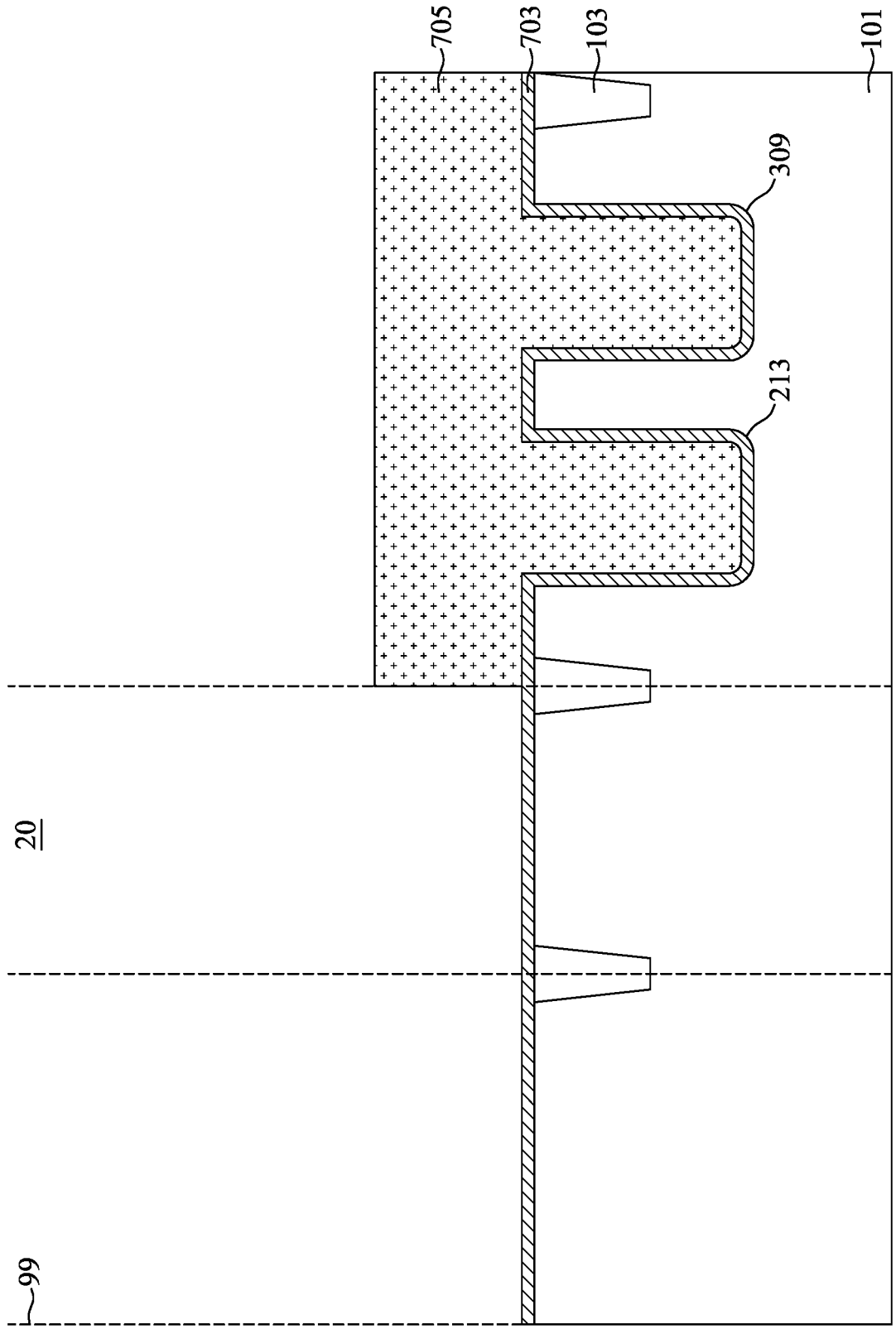
Figure 21:
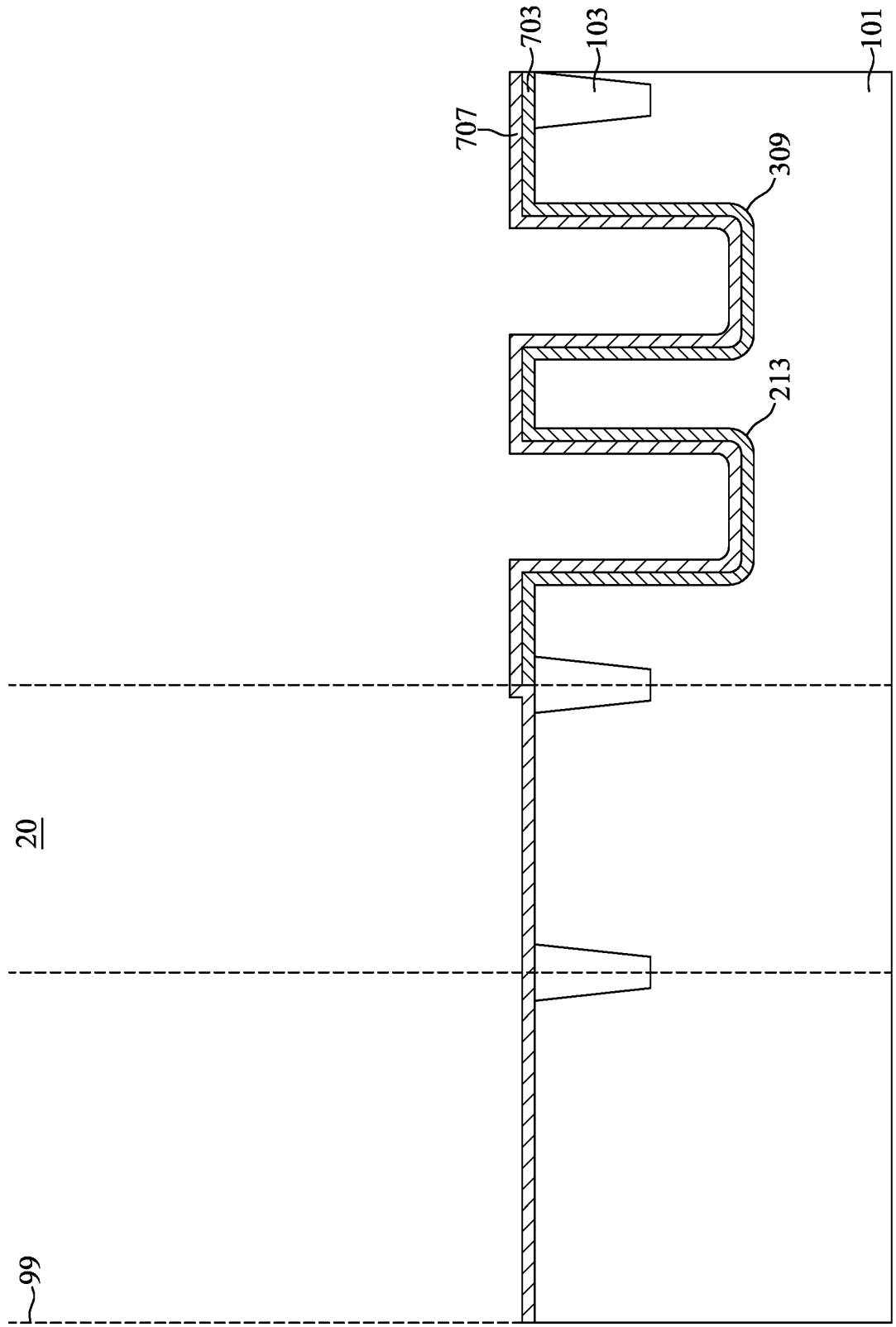

With reference to FIG. 20, a first mask layer 705 may be formed over the substrate 101 to cover the first trench 213 and the second trench 309. With reference to FIG. 21, an etch process, such as an anisotropic dry etch process, may be performed to remove portions of the bottom insulating film 703. After the etch process, the first mask layer 705 may be removed. A bottom conductive film 707 may be sequentially formed to cover the top surface of the substrate 101 and the bottom insulating film 703. The bottom conductive film 707 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride.

Figure 22:
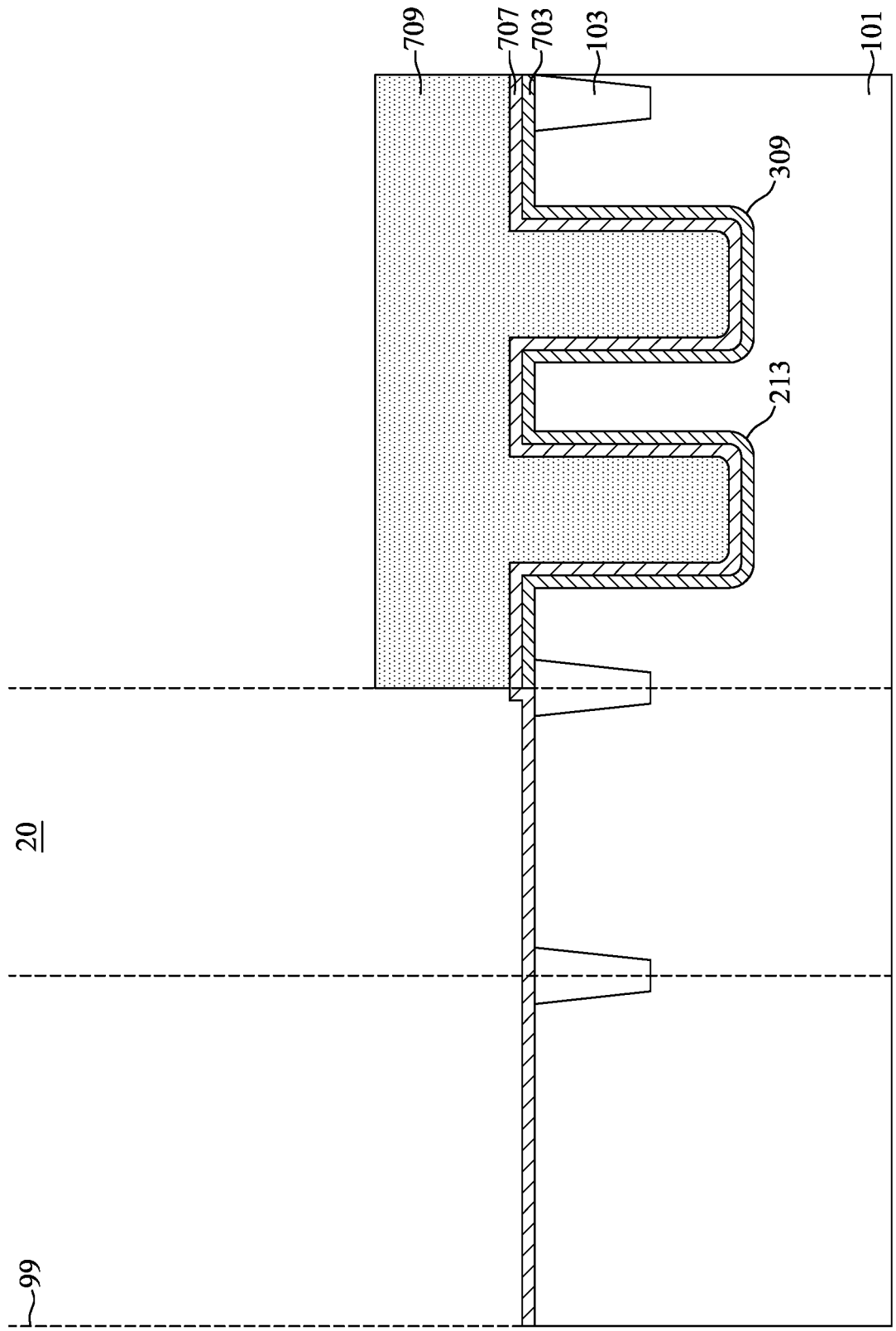
Figure 23:
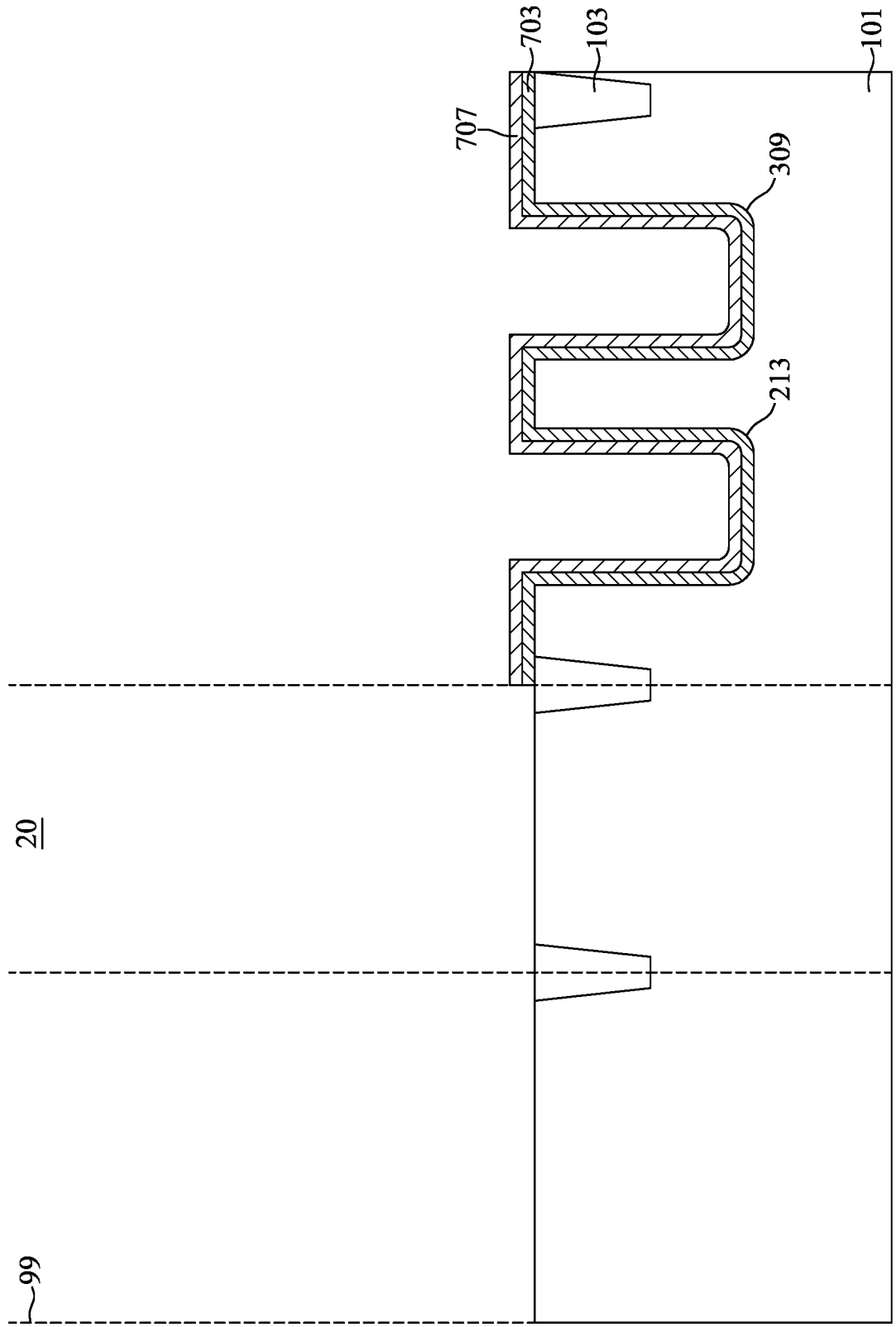
Figure 24:
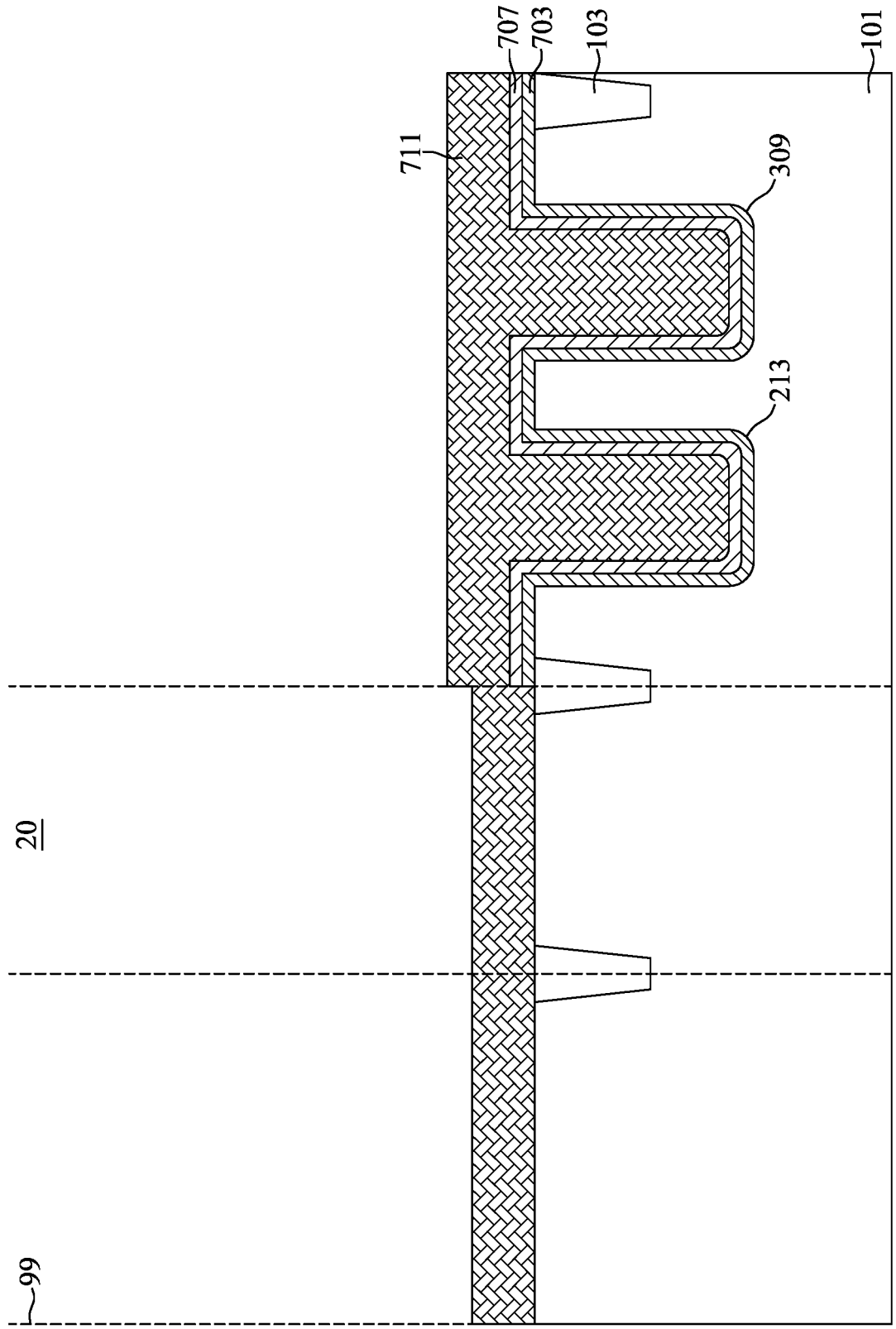

With reference to FIG. 22, a second mask layer 709 may be formed over the substrate 101 to cover the first trench 213 and the second trench 309. With reference to FIG. 23, an etch process, such as an anisotropic dry etch process, may be performed to remove portions of the bottom conductive film 707. After the etch process, the second mask layer 709 may be removed. With reference to FIG. 24, a filler film 711 may be sequentially formed to cover the top surface of the substrate 101 and the bottom conductive film 707. The filler film 711 may be formed of, for example, tungsten or aluminum.

Figure 25:
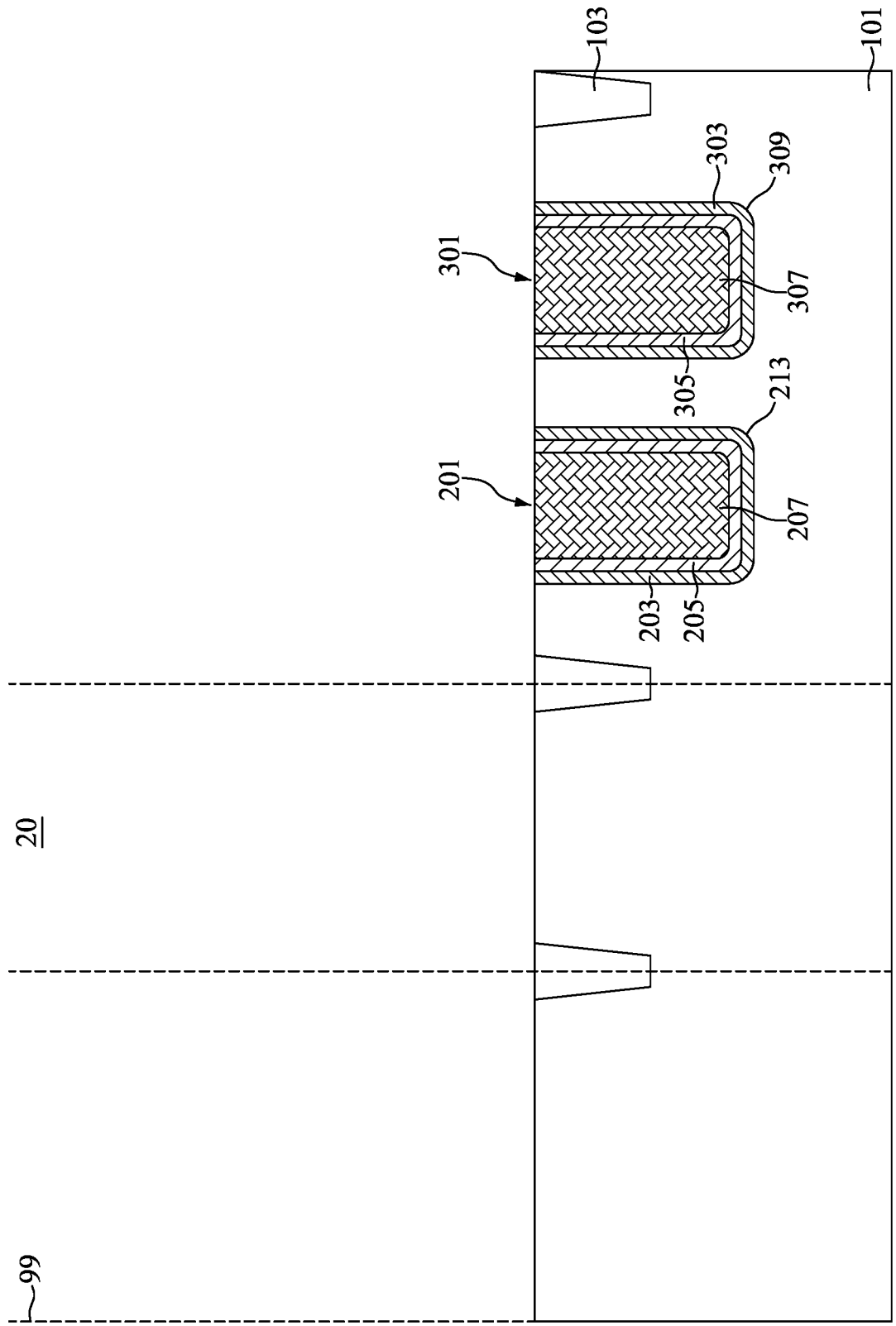

With reference to FIG. 25, a planarization process, such as chemical mechanical polishing, may be performed to concurrently form the first crack-detecting structure 201 and the second crack-detecting structure 301. After the planarization process, the bottom insulating film 703 may be turned into a first bottom insulating layer 203 and a second bottom insulating layer 303. The bottom conductive film 707 may be turned into a first bottom conductive layer 205 and a second bottom conductive layer 305. The filler film 711 may be turned into a first filler layer 207 and a second filler layer 307. The first bottom insulating layer 203, the first bottom conductive layer 205, and the first filler layer 207 together form the first crack-detecting structure 201. The second bottom insulating layer 303, the second bottom conductive layer 305, the second filler layer 307 together form the second crack-detecting structure 301.

Figure 26:
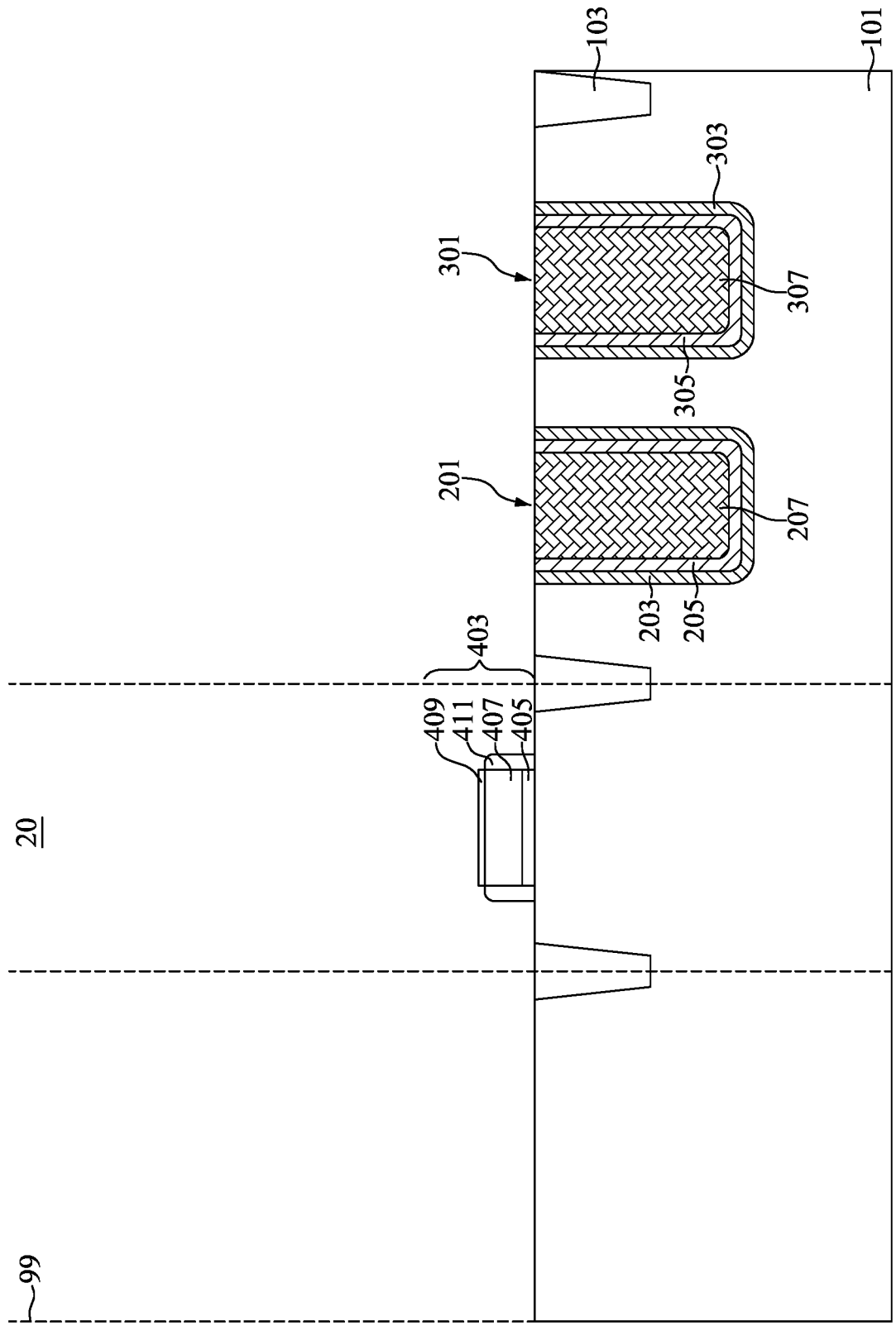
Figure 27:
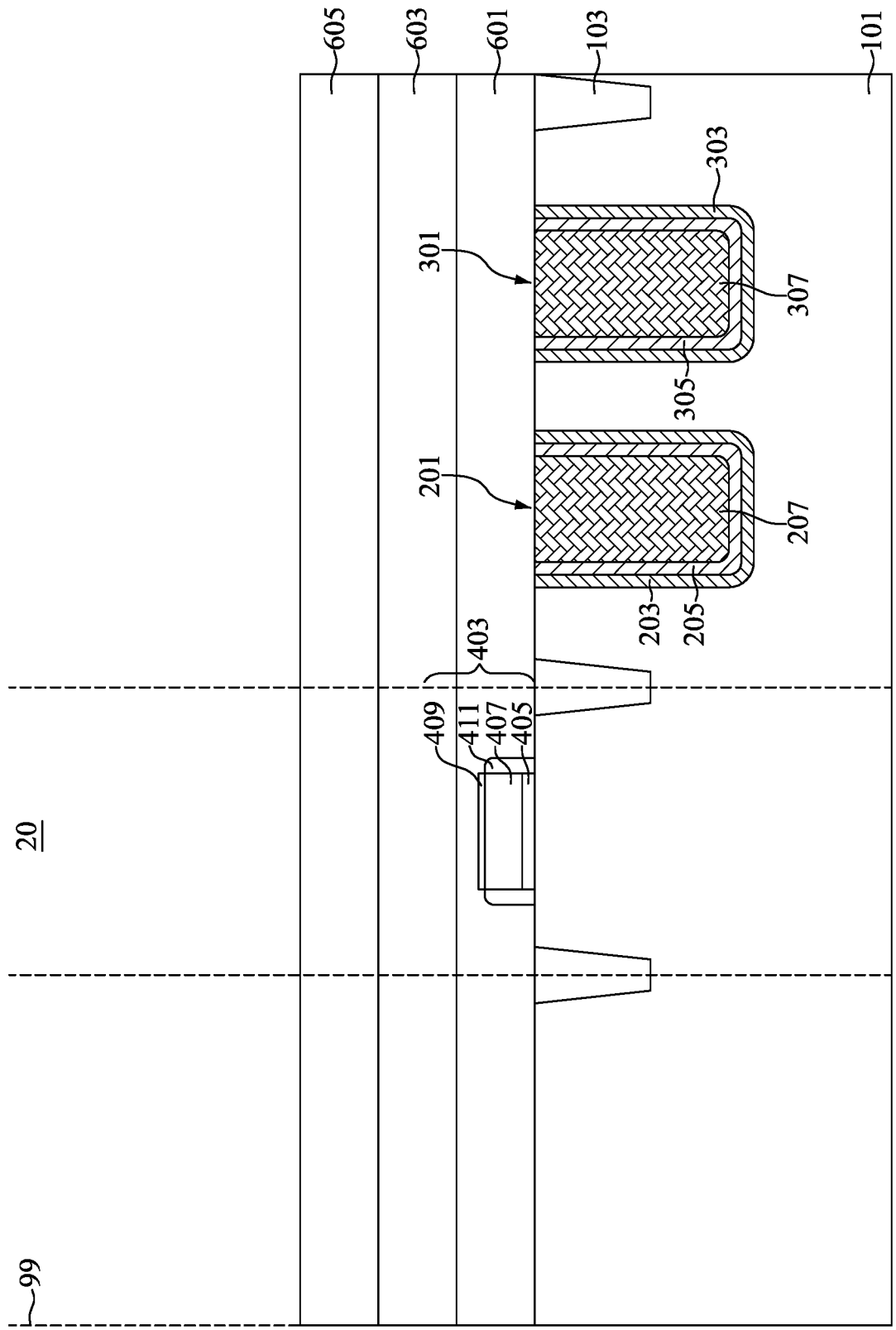

With reference to FIGS. 17 and 26 to 29, at step S15, in the embodiment depicted, a stress-dissipating structure 401 and a guard structure 501 may be formed on the substrate 101 and next to the first crack-detecting structure 201. With reference to FIG. 26, a dummy switch unit 403 may be formed on the substrate 101 and next to the first crack-detecting structure 201. The dummy switch unit 403 may include a dummy switch unit insulating layer 405, a dummy switch unit bottom conductive layer 407, a dummy switch unit top conductive layer 409, and a plurality of dummy switch unit spacers 411. The dummy switch unit insulating layer 405 may be formed on the substrate 101. The dummy switch unit bottom conductive layer 407 may be formed on the dummy switch unit insulating layer 405. The plurality of dummy switch unit spacers 411 may be formed by depositing an insulating layer, then performing an etch process to remove portions of the insulating layer to concurrently form the plurality of dummy switch unit spacers 411 attached to sidewalls of the dummy switch unit insulating layer 405 and the dummy switch unit bottom conductive layer 407. The dummy switch unit top conductive layer 409 may be formed on the dummy switch unit bottom conductive layer 407. With reference to FIG. 27, a first insulating film 601, a second insulating film 603, and a third insulating film 605 may be sequentially formed on the substrate 101. A planarization process, such as chemical mechanical polishing, may be performed over the third insulating film 605 to provide a substantially flat surface for subsequent processing steps.

Figure 28:
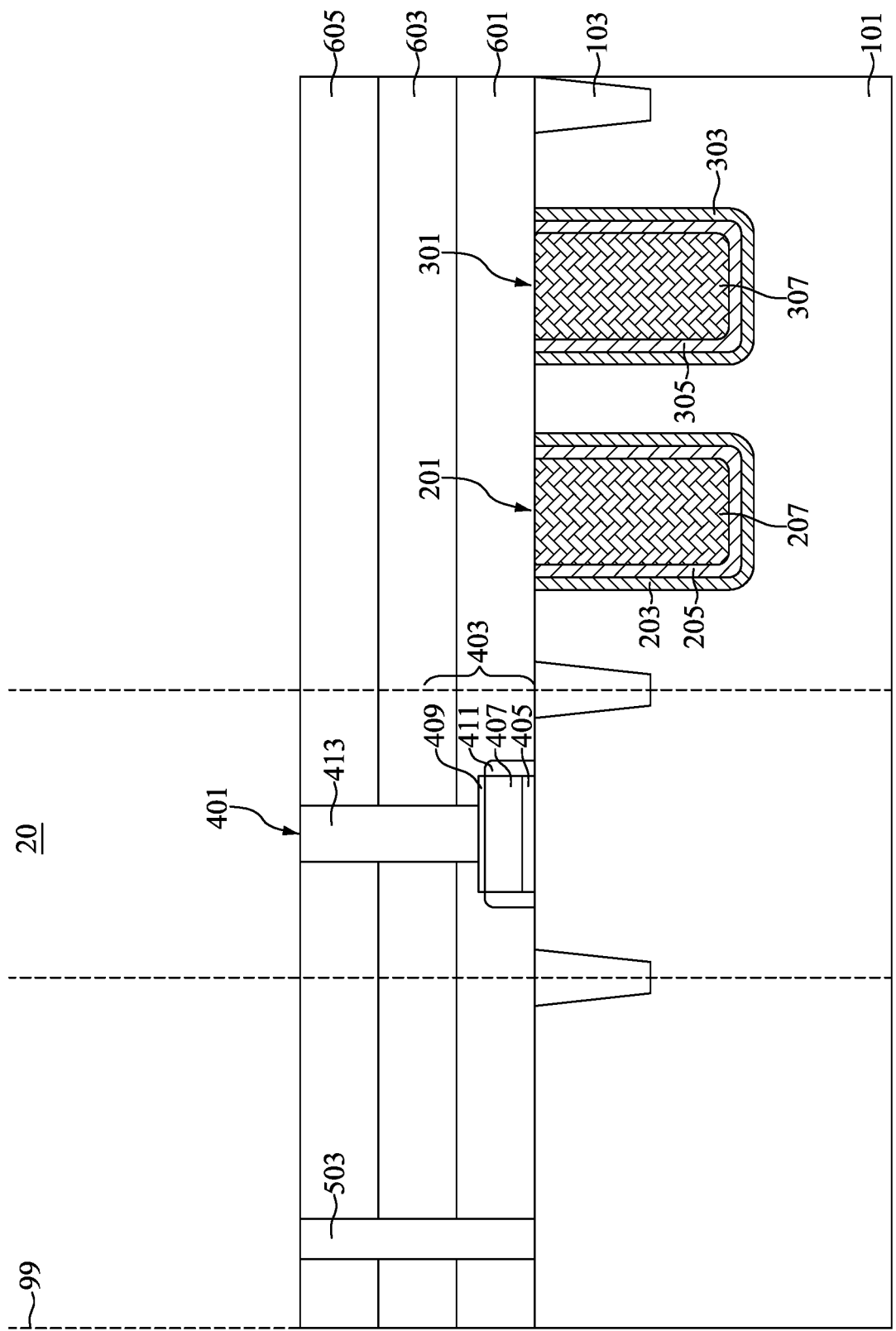

With reference to FIG. 28, a photolithography process may be performed to define positions of a plurality of dummy conductive plugs 413 and a guard conductive plug 503. After the photolithography process, an etch process, such as an anisotropic dry etch process, may be performed to form trenches in the third insulating film 605, the second insulating film 603, and the first insulating film 601. A conductive material may be deposited into the trenches by a metallization process. After the metallization process, a planarization process, such as chemical mechanical polishing, may be performed to remove excess material, provide a substantially flat surface for subsequent processing steps, and conformally form the plurality of dummy conductive plugs 413 and the guard conductive plug 503. The plurality of dummy conductive plugs 413 and the dummy switch unit 403 together form the stress-dissipating structures 401.

Figure 29:
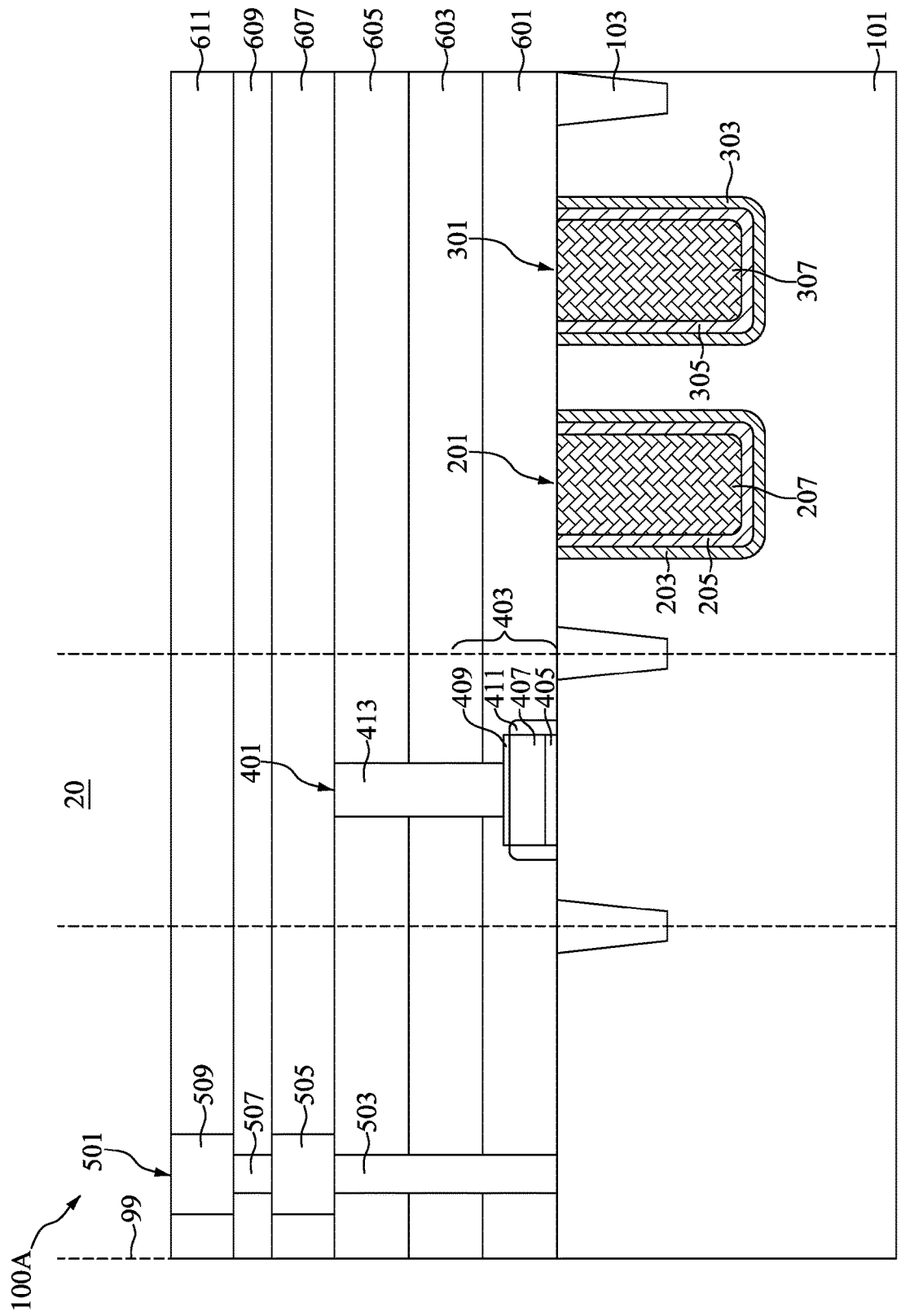

With reference to FIG. 29, a fourth insulating film 607 may be formed on the third insulating film 605. A guard first conductive layer 505 may be formed on the guard conductive plug 503 and in the fourth insulating film 607 by, for example, a damascene process. A fifth insulating film 609 and a sixth insulating film 611 may be sequentially formed on the fourth insulating film 607. A guard second conductive layer 509 and a guard first conductive via 507 may be respectively correspondingly formed in the sixth insulating film 611 and the fifth insulating film 609 by, for example, a dual damascene process. The guard conductive plug 503, the guard first conductive layer 505, the guard first conductive via 507, and the guard second conductive layer 509 together form the guard structure 501.

Due to the design of the semiconductor device of the present disclosure, it is possible to detect cracks electrically while the electrical characteristics are tested, and the efficiency of manufacturing the semiconductor device may be thereby improved. In addition, the electrical crack-detecting capacity of the semiconductor device may also be used to detect latent damage which is difficult to detect by visual inspection. In addition, it is also possible to perform semiconductor device sorting with more consistency, more certainty and greater ease. Furthermore, it is also possible to eliminate the visual inspection process. As a result, the semiconductor device of the present disclosure may reduce the number of inspectors and shorten the inspection process, thus greatly reducing cost.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:
1. A semiconductor device, comprising:
    a substrate;
    a first crack-detecting structure positioned in the substrate and comprising a first insulating stack inwardly positioned in the substrate, a first bottom conductive layer positioned on the first insulating stack, and a first filler layer positioned on the first bottom conductive layer; and a second crack-detecting structure positioned adjacent to the first crack-detecting structure and comprising a second insulating stack inwardly positioned in the substrate, a second bottom conductive layer positioned on the second insulating stack, and a second filler layer positioned on the second bottom conductive layer;
wherein the first crack-detecting structure comprises a first top conductive layer positioned between the first bottom conductive layer and the first filler layer.

2. The semiconductor device of claim 1, further comprising a plurality of stress-dissipating structures positioned on the substrate and next to the first crack-detecting structure.

3. The semiconductor device of claim 2, further comprising a guard structure positioned on the substrate and adjacent to the plurality of stress-dissipating structures.

4. The semiconductor device of claim 3, further comprising a recess positioned on the substrate and between the plurality of stress-dissipating structures and the guard structure.

5. The semiconductor device of claim 3, wherein at least one of the plurality of stress-dissipating structures comprises a dummy conductive plug positioned on the substrate, and sidewalls of the dummy conductive plug are flat.

6. The semiconductor device of claim 3, wherein at least one of the plurality of stress-dissipating structures comprises a dummy switch unit positioned on the substrate and a dummy conductive plug positioned on the dummy switch unit.

7. The semiconductor device of claim 6, wherein the dummy switch unit comprises a dummy switch unit insulating layer positioned on the substrate, a dummy switch unit bottom conductive layer positioned on the dummy switch unit insulating layer, a plurality of dummy switch unit spacers attached to sidewalls of the dummy switch unit bottom conductive layer and the dummy switch unit insulating layer, and a dummy switch unit top conductive layer positioned on the dummy switch unit bottom conductive layer, wherein the dummy conductive plug is positioned on the dummy switch unit top conductive layer.

8. The semiconductor device of claim 1, wherein the first bottom conductive layer has a thickness between about 10 angstroms and about 100 angstroms.

9. The semiconductor device of claim 8, wherein the first top conductive layer has a thickness between about 10 angstroms and about 200 angstroms.

10. The semiconductor device of claim 3, wherein the first insulating stack comprises a first bottom insulating layer inwardly positioned in the substrate, the second insulating stack comprises a second bottom insulating layer inwardly positioned in the substrate, wherein the first bottom insulating layer has a same thickness as the second bottom insulating layer.

11. The semiconductor device of claim 3, wherein the first insulating stack comprises a first bottom insulating layer inwardly positioned in the substrate and a first top insulating layer positioned on the first bottom insulating layer, the second insulating stack comprises a second bottom insulating layer inwardly positioned in the substrate, and the first insulating stack has a thickness greater than a thickness of the second insulating stack.

12. The semiconductor device of claim 3, further comprising a plurality of doped regions positioned adjacent to the first crack-detecting structure and the second crack-detecting structure.

13. The semiconductor device of claim 3, wherein at least one of the plurality of stress-dissipating structures has a rectangular shape and extends along a first direction, wherein the plurality of stress-dissipating structures are separate from each other and lengths of the plurality of stress-dissipating structures are sequentially decreasing along a second direction perpendicular to the first direction.

14. The semiconductor device of claim 3, wherein widths of the plurality of stress-dissipating structures are the same.

15. The semiconductor device of claim 3, further comprising an isolation layer positioned in the substrate, wherein the first crack-detecting structure has a depth deeper than a depth of the isolation layer.

16. The semiconductor device of claim 3, wherein the guard structure has a square shape.

17. The semiconductor device of claim 16, wherein the guard structure comprises a guard conductive plug positioned on the substrate and sidewalls of the guard conductive plug are flat.

18. The semiconductor device of claim 3, wherein the plurality of stress-dissipating structures have an accordant shape and dimension.

19. A method for fabricating a semiconductor device, comprising:
providing a substrate comprising a first trench in the substrate and a second trench next to the first trench;
forming a first crack-detecting structure in the first trench and comprising a first insulating stack in the first trench, a first bottom conductive layer on the first insulating stack, and a first filler layer on the first bottom conductive layer, wherein the first crack-detecting structure comprises a first top conductive layer positioned between the first bottom conductive layer and the first filler layer; and
forming a second crack-detecting structure in the second trench and comprising a second insulating stack in the second trench, a second bottom conductive layer on the second insulating stack, and a second filler layer on the second bottom conductive layer.

* * * * *